(12) United States Patent
Tonegawa et al.

(10) Patent No.: US 10,121,958 B2
(45) Date of Patent: Nov. 6, 2018

(54) SEMICONDUCTOR DEVICE AND METHOD OF MANUFACTURING SAME

(71) Applicant: Renesas Electronics Corporation, Tokyo (JP)

(72) Inventors: Takashi Tonegawa, Ibaraki (JP); Keiji Sakamoto, Ibaraki (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/060,820

(22) Filed: Mar. 4, 2016

(65) Prior Publication Data

US 2016/0284980 A1    Sep. 29, 2016

(30) Foreign Application Priority Data

Mar. 24, 2015   (JP) .................. 2015-060878

(51) Int. Cl.
| | |
|---|---|
| H01L 43/02 | (2006.01) |
| H01L 43/08 | (2006.01) |
| H01L 43/12 | (2006.01) |
| H01L 27/22 | (2006.01) |

(52) U.S. Cl.
CPC ............ *H01L 43/02* (2013.01); *H01L 27/228* (2013.01); *H01L 43/08* (2013.01); *H01L 43/12* (2013.01)

(58) Field of Classification Search
CPC ....... H01L 27/228; H01L 43/02; H01L 43/08; H01L 43/12
USPC ......................................................... 257/421
See application file for complete search history.

(56) References Cited

U.S. PATENT DOCUMENTS

| | | | |
|---|---|---|---|
| 8,716,818 B2 | 5/2014 | Yoshikawa et al. | |
| 9,065,041 B2 | 6/2015 | Kariyada et al. | |
| 2004/0188732 A1 | 9/2004 | Fukuzumi | |
| 2009/0209050 A1* | 8/2009 | Wang ................ | H01L 27/228 438/3 |
| 2010/0047930 A1* | 2/2010 | Hosotani ............ | H01L 27/228 438/3 |

(Continued)

FOREIGN PATENT DOCUMENTS

| | | |
|---|---|---|
| JP | 2004-349671 A | 12/2004 |
| JP | 2013-16587 A | 1/2013 |

(Continued)

OTHER PUBLICATIONS

Communication dated Jul. 24, 2018 issued by the Japanese Patent Office in counterpart application No. 2015-060878.

*Primary Examiner* — Moazzam Hossain
*Assistant Examiner* — Warren H Kilpatrick
(74) *Attorney, Agent, or Firm* — Sughrue Mion, PLLC

(57) ABSTRACT

An object is to prevent a short failure in magnetic tunnel junction and thereby suppress a semiconductor device having a magnetic memory cell from having deteriorated reliability. First, a data reference layer and a cap layer are patterned. After formation of an oxygen-free first insulating film on their side walls, a base layer, a data recording layer, and a tunnel barrier layer are patterned. During patterning of the base layer, data recording layer, and tunnel barrier layer, adhesion of a metal substance of the data reference layer and the cap layer to the side wall of the tunnel barrier layer can be prevented because the data reference layer and the cap layer are covered by the first insulating film.

15 Claims, 33 Drawing Sheets

(56) References Cited

U.S. PATENT DOCUMENTS

2012/0074511 A1* 3/2012 Takahashi ............. H01L 27/228
  257/427
2013/0248355 A1 9/2013 Ohsawa et al.

FOREIGN PATENT DOCUMENTS

JP   2013-187409 A   9/2013
JP   2014-241428 A   12/2014

* cited by examiner

SEMICONDUCTOR DEVICE AND METHOD OF MANUFACTURING SAME

CROSS-REFERENCE TO RELATED APPLICATIONS

The disclosure of Japanese Patent Application No. 2015-060878 filed on Mar. 24, 2015 including the specification, drawings, and abstract is incorporated herein by reference in its entirety.

BACKGROUND

The present invention relates to a semiconductor device and a method of manufacturing the same which are suited for use, for example, in a semiconductor device having a magnetic memory and manufacture of it.

In magnetic memories such as magnetic random access memory (MRAM), a magnetoresistance effect element is used as a magnetic memory cell. A typical magnetoresistance effect element is equipped with a magnetic tunnel junction (MTJ) in which a tunnel barrier layer is sandwiched between two magnetic layers.

For example, Japanese Unexamined Patent Application Publication No. 2013-187409 (Patent Document 1) describes a magnetic memory equipped with a data recording layer, a tunnel barrier layer formed on the data recording layer, a data reference layer formed on the tunnel barrier layer so as to partially cover the tunnel barrier layer, and a metal oxide layer formed on a portion of the tunnel barrier layer not covered by the data reference layer.

[Patent Document]

[Patent Document 1] Japanese Unexamined Patent Application Publication No. 2013-187409

SUMMARY

Some magnetic memory cells have a structure in which an upper magnetic layer, between two magnetic layers, covers a tunnel barrier layer only partially. In the magnetic memory cells having such a structure, however, metal substances contained in the upper magnetic layer may inevitably attach to the side wall of the processed tunnel barrier layer at the time of etching of the upper magnetic layer. The upper magnetic layer and the lower magnetic layer therefore cause a short-circuit and form a leakage path. As a result, this interferes with normal data recording of the magnetic memory cells.

Another problem and novel features will be apparent from the description herein and accompanying drawings.

In one embodiment, there is provided a semiconductor device having a data recording layer, a tunnel barrier layer formed on the data recording layer, a data reference layer formed on a portion of the tunnel barrier layer, and a cap layer formed on the data reference layer. In plan view, the data recording layer and the tunnel barrier layer having the same shape overlap with each other; the data reference layer and the cap layer having the same shape overlap with each other; and the data reference layer is embraced by the data recording layer. Further, a first insulating film lies in contact with the respective side walls of the data reference layer and the cap layer, while no first insulating film lies on the respective side walls of the data recording layer and the tunnel barrier layer.

In another embodiment, there is also provided a method of manufacturing a semiconductor device including a step of successively depositing a data recording layer, a tunnel barrier layer, a data reference layer, and a cap layer and a step of processing the data reference layer and the cap layer by using a first mask. It includes, after these steps, a step of depositing a first insulating film so as to cover therewith the data recording layer, the tunnel barrier layer, the data reference layer, and the cap layer, a step of depositing a second insulating film on the first insulating film, and a step of processing the data recording layer, the tunnel barrier layer, the first insulating film, and the second insulating film by using a second mask. The data reference layer and the cap layer are processed so that in plan view, they overlap with each other while having the same shape. The data recording layer and the tunnel barrier layer are processed, with the respective side walls of the data reference layer and the cap layer being covered with the first insulating film, so that in plan view, the data recording layer and the tunnel barrier layer having the same shape overlap with each other and at the same time, the data recording layer embraces the data reference layer.

These embodiments can prevent a short-circuit in a magnetic tunnel junction and thereby inhibit a semiconductor device having a magnetic memory cell from having deteriorated reliability.

BRIEF DESCRIPTION OF THE DRAWINGS

FIGS. 4A to 4C are schematic views of the magnetic memory cell for describing the operation of the magnetic memory cell according to First Embodiment, in which FIG. 4A is a schematic view of the magnetic memory cell for describing the write operation of data "1" into the magnetic memory cell; FIG. 4B is a schematic view of the magnetic memory cell for describing the write operation of "data 0" into the magnetic memory cell; and FIG. 4C is a schematic view of the magnetic memory cell for describing the data read operation from the magnetic memory cell;

DETAILED DESCRIPTION

Figure 1:
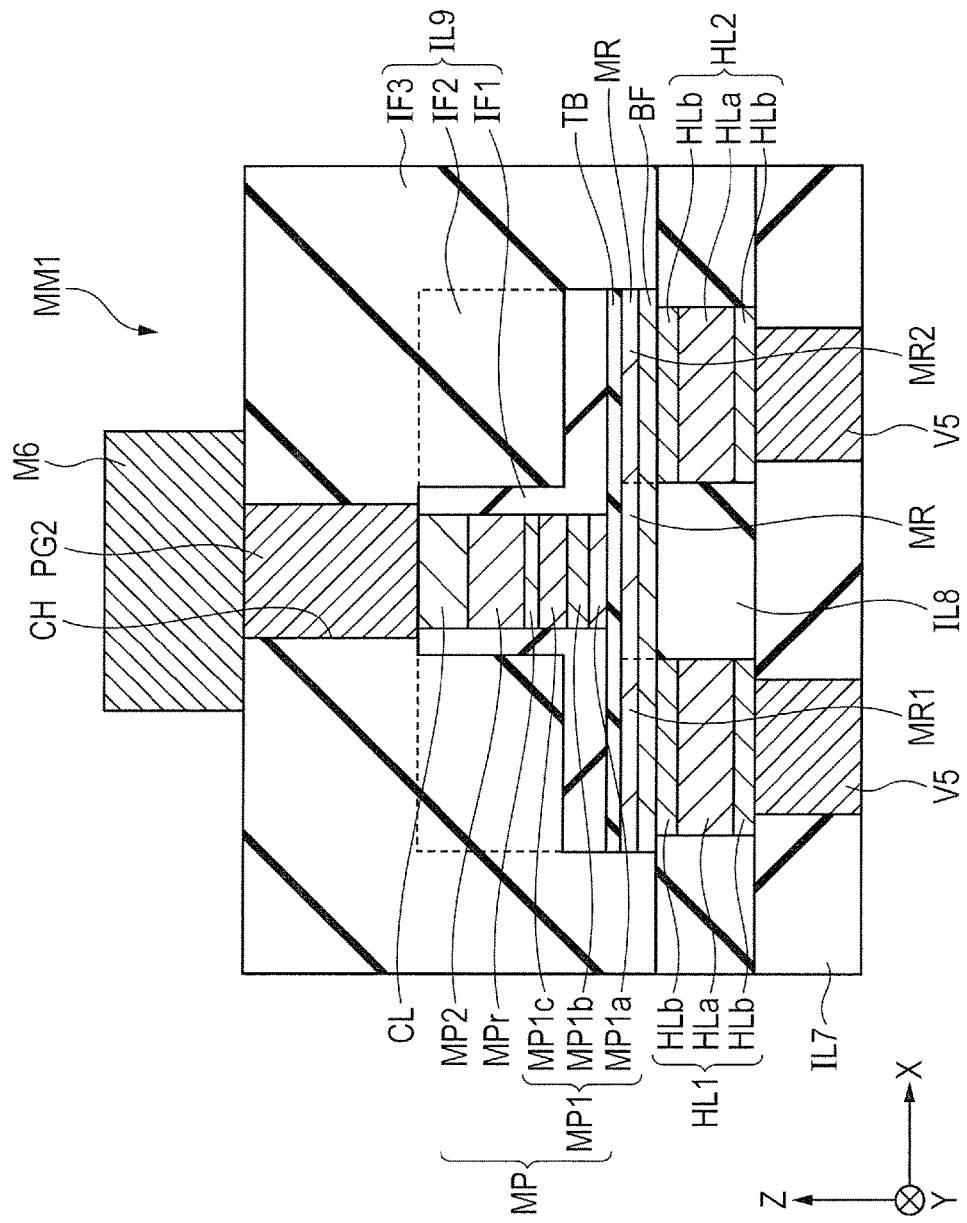
FIG. 1 is a fragmentary cross-sectional view showing a magnetic memory cell according to First Embodiment.

In the following embodiments, a description may be made after divided into a plurality of sections or embodiments if necessary for the sake of convenience. These sections or embodiments are not independent from each other unless otherwise particularly specified, but one of them may be a modification example, details, complementary description, or the like of a part or whole of the other one.

In the following embodiments, when a reference is made to the number (including the number, value, amount, range, or the like) of a component, the number is not limited to a specific number but may be more or less than the specific number, unless otherwise particularly specified or principally apparent that the number is limited to the specific number.

Further, in the following embodiments, it is needless to say that the constituent component (including component step or the like) is not always essential unless otherwise particularly specified or principally apparent that it is essential.

In addition, it is needless to say that terms "is made of A", "is comprised of A", "has A", or "contains A" do not exclude components other than A unless otherwise particularly specified that it means "consists of A". Similarly, in the following embodiments, when a reference is made to the shape, positional relationship, or the like of the constituent component, that substantially approximate or analogous to it is also embraced unless otherwise particularly specified or principally apparent that it is not. This also applies to the above-mentioned value, range, or the like.

Further, in the following embodiments, a silicon nitride film is expressed by an $Si_3N_4$ film according to its stoichiometric composition, but it embraces not only it but also a silicon nitride film made of a silicon nitride and having an analogous composition (composition different from the stoichiometric composition). Similarly, a silicon oxide film is expressed by an $SiO_2$ film according to its stoichiometric composition, but it embraces not only it but also a silicon oxide film made of a silicon oxide and having an analogous composition (composition different from the stoichiometric composition).

In the drawings to be used in the following embodiments, even a plan view is sometimes hatched to make it easier to understand. In all the drawings for describing the embodiments, members having the same function will be identified by the same reference numerals and overlapping descriptions will be omitted. Present embodiments will hereinafter be described in detail based on drawings.

(Semiconductor Device Investigated by Comparison by the Present Inventors)

First, a problem of a magnetic memory cell investigated by comparison by the present inventors is described in detail in order to make clear the semiconductor device and manufacturing method thereof according to the embodiments of the invention.

FIGS. 33A and 33B to FIGS. 35A and 35B are respectively a fragmentary cross-sectional view and a fragmentary plan view showing manufacturing steps of a magnetic memory cell of Comparative Example investigated by comparison by the present inventors.

Figure 33A:
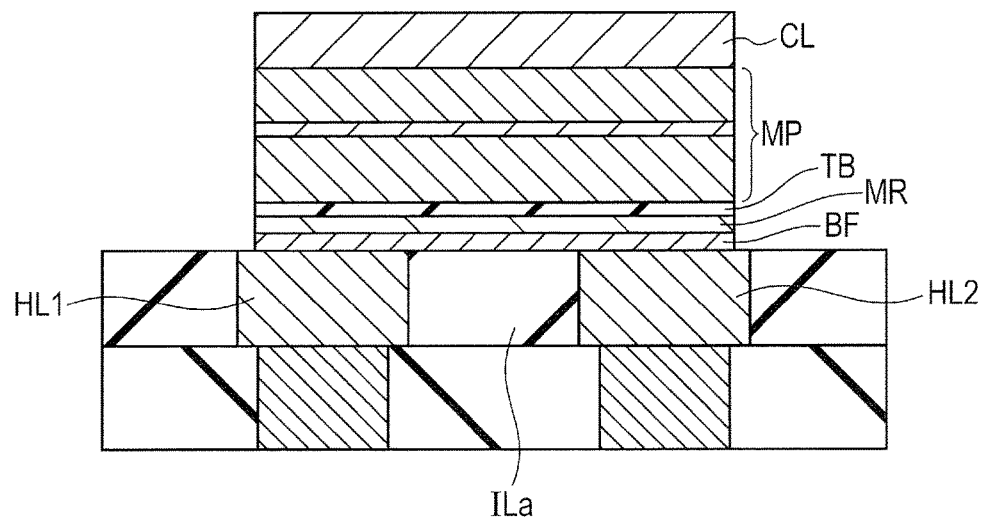
FIGS. 33A and 33B are, respectively, a fragmentary cross-sectional view and a fragmentary plan view showing a manufacturing step of a magnetic memory cell of Comparative Example investigated by comparison by the present inventors.
Figure 33B:
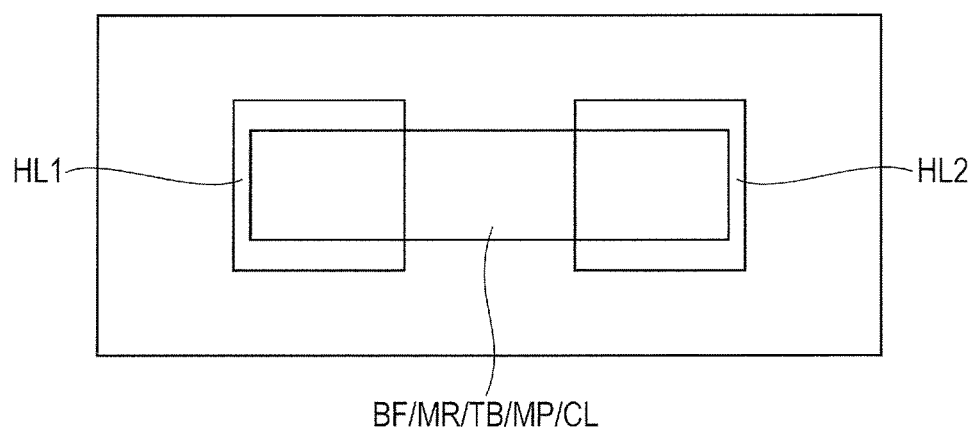

As shown in FIGS. 33A and 33B, when the magnetic memory cell of Comparative Example is manufactured, first, magnetic pinned layers HL1 and HL2 are formed. A base layer BF, a data recording layer MR, a tunnel barrier layer TB, a data reference layer MP, and a cap layer CL are then formed successively on an interlayer insulating film ILa filled with the magnetic pinned layers HL1 and HL2. With a hard mask, the cap layer CL, the data reference layer MP, the tunnel barrier layer TB, the data recording layer MR, and the base layer BF are etched successively to pattern the base layer BF, the data recording layer MR, and the tunnel barrier layer TB into a predetermined shape.

Figure 34A:
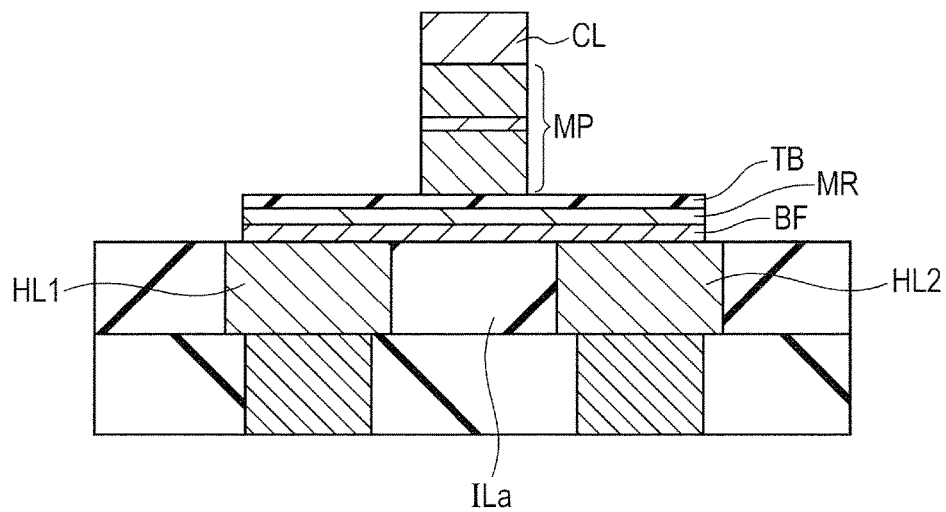
FIGS. 34A and 34B are, respectively, a fragmentary cross-sectional view and a fragmentary plan view showing a manufacturing step of the magnetic memory cell of Comparative Example following those of FIGS. 33A and 33B.
Figure 34B:
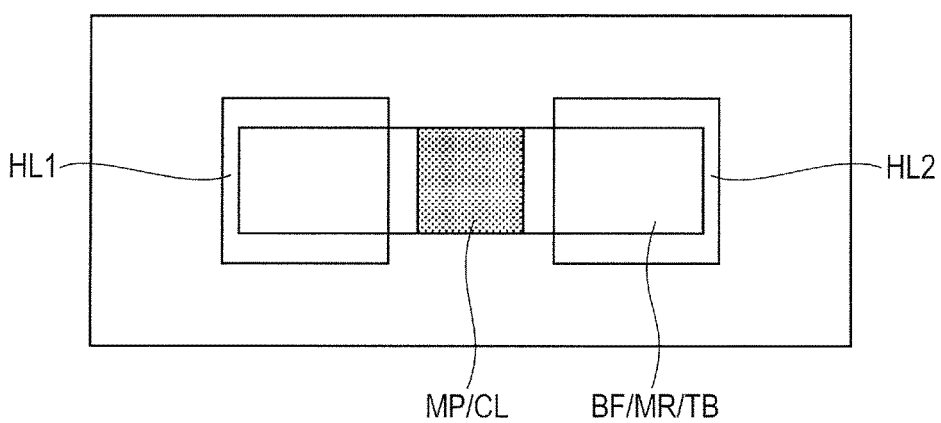

Next, as shown in FIGS. 34A and 34B, the cap layer CL and the data reference layer MP are etched successively using a resist mask to pattern the data reference layer MP and the cap layer CL into a predetermined shape. By this etching, a magnetic tunnel junction comprised of the data recording layer MR, the tunnel barrier layer TB, and the data reference layer MP is formed.

Figure 35A:
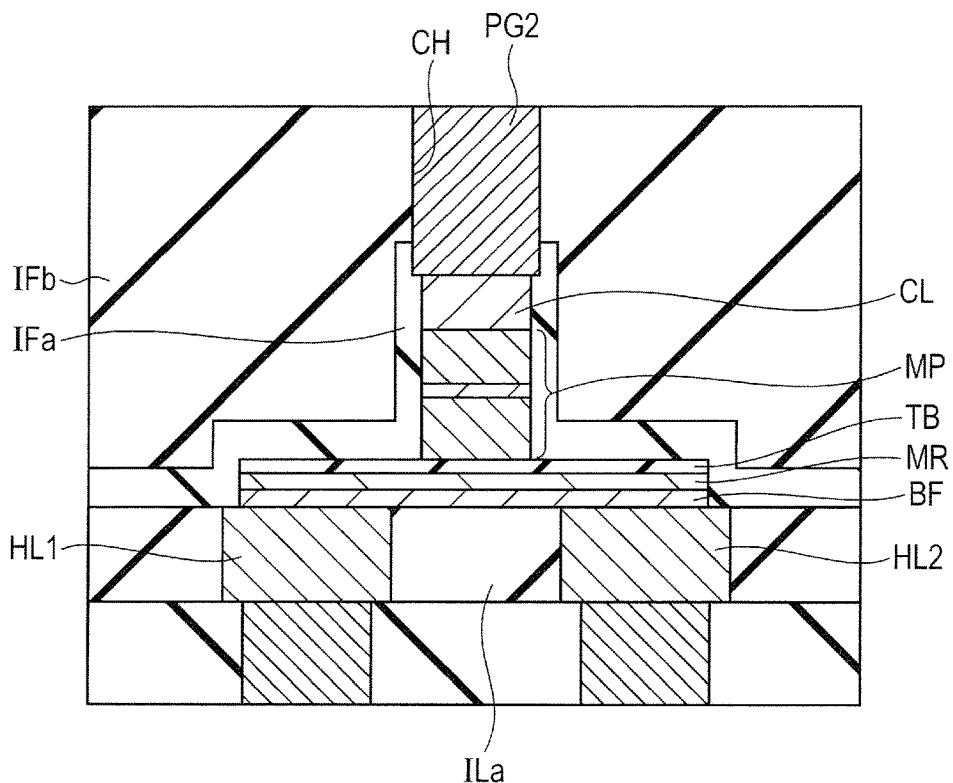
FIGS. 35A and 35B are, respectively, a fragmentary cross-sectional view and a fragmentary plan view showing a manufacturing step of the magnetic memory cell of Comparative Example following those of FIGS. 34A and 34B.
Figure 35B:
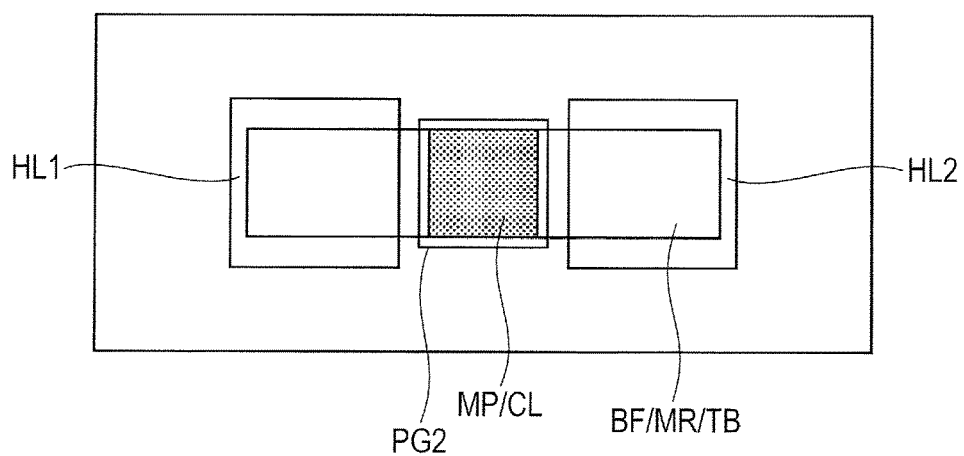

Next, as shown in FIGS. 35A and 35B, a first insulating film IFa and a second insulating film IFb are formed so as to cover therewith the base layer BF, the data recording layer MR, the tunnel barrier layer TB, the data reference layer MP, and the cap layer CL. The first insulating film IFa is, for example, an $Si_3N_4$ film and the second insulating film IFb is, for example, an $SiO_2$ film. After formation of a contact hole CH in the first insulating film IFa and second insulating film IFb on the upper surface of the cap layer CL, a plug PG is formed inside the contact hole CH.

The magnetic memory cell manufactured according to Comparative Example, however, has such a problem that a leakage path is formed due to a short-circuit between the data recording layer MR and the data reference layer MP and it interferes with normal data recording of the magnetic memory cell. This problem occurs because metal substances, for example, Pt, Ru, and Ta configuring the data reference layer MP and the cap layer CL attach to the exposed upper surface and side wall of the tunnel barrier layer TB during etching of these layers.

Described specifically, during etching of the data reference layer MP and the cap layer CL, the tunnel barrier layer TB has already been patterned and the side wall of the tunnel barrier layer TB has been exposed. It is therefore presumed that metal substances such as Pt, Ru, and Ta configuring the data reference layer MP and the cap layer CL therefore attaches to the exposed upper surface and side wall of the tunnel barrier layer TB and causes a short-circuit between the data recording layer MR and the data reference layer MP.

Patent Document 1 describes a technology of forming a metal oxide layer on a portion of a tunnel barrier layer not covered by a data reference layer and thereby inhibiting a short circuit between the data recording layer and the data reference layer. Although this method can inhibit short circuiting between the data recording layer and the data reference layer due to over-etching of the data reference layer, it is presumed to be difficult to suppress generation of a short-circuit between the data recording layer and the data reference layer caused by metal substances that attach to the side wall of the tunnel barrier layer.

First Embodiment

Configuration of Magnetic Memory Cell

Figure 2:
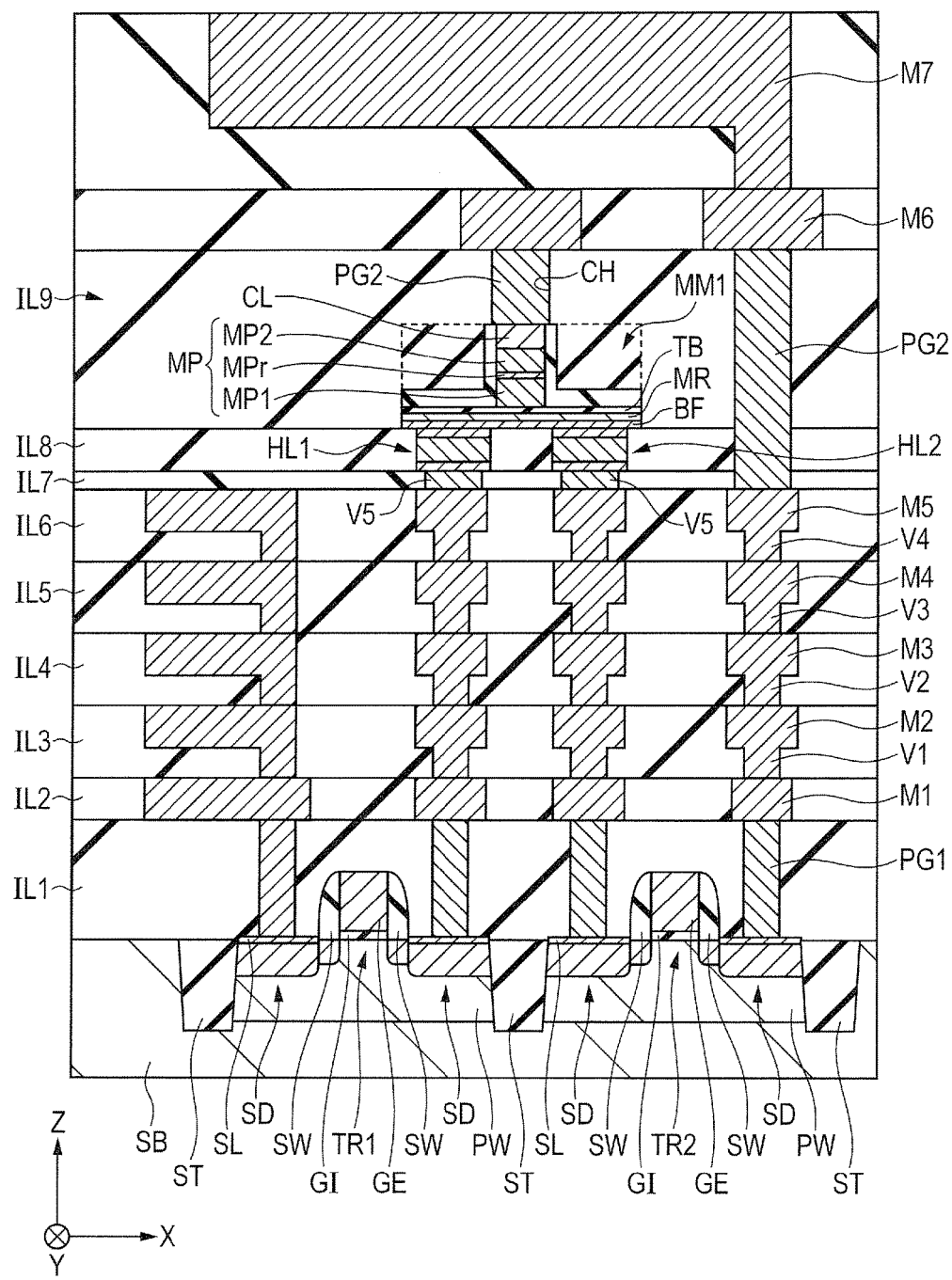
FIG. 2 is a fragmentary cross-sectional view showing a semiconductor device having the magnetic memory cell according to First Embodiment.

The configuration of a magnetic memory cell according to First Embodiment will be described referring to FIGS. 1 and 2. FIG. 1 is a fragmentary cross-sectional view showing the magnetic memory cell according to First Embodiment. FIG. 2 is a fragmentary cross-sectional view showing a semiconductor device having the magnetic memory cell according to First Embodiment.

As shown in FIG. 1, a magnetic memory cell MM1 is a so-called magnetic domain wall displacement type magnetic memory cell and has magnetic pinned layers HL1 and HL2, a base layer BF, a data recording layer MR, a tunnel barrier layer TB, data reference layer MP, and a cap layer CL. In First Embodiment, the data recording layer (magnetic layer) MR, the tunnel barrier layer (insulating layer) TB, and a first ferromagnetic layer (magnetic layer) MP1 configuring the data reference layer MP configure a magnetic tunnel junction.

In the following description, the direction along which these layers configuring the magnetic memory cell MM1 are stacked is defined as Z direction and the plane orthogonal to the Z direction is defined as XY plane.

The magnetic pinned layers HL1 and HL2 are layers having pinned magnetization, are magnetically hard, and are comprised of a ferromagnetic material having perpendicular magnetic anisotropy (PMA). The magnetic pinned layers HL1 and HL2 respectively have magnetization directions pinned to anti-parallel to each other. In First Embodiment, the magnetization of the magnetic pinned layer HL1 is pinned to a +Z direction (upward direction) and the magnetization of the magnetic pinned layer HL2 is fixed to a −Z direction (downward direction). The magnetic pinned layers HL1 and HL2 have a function of pinning magnetization of a portion of the data recording layer MR by exchange coupling or magnetostatic coupling.

The magnetic pinned layers HL1 and HL2 have, for example, a structure in which ferromagnetic film HLa is sandwiched by upper and lower metal films HLb. As the ferromagnetic film HLa, for example, a Co/Pt stacked film can be used. The term "Co/Pt stacked film" means a film stack obtained by stacking a thin Co film and a thin Pt film in repetition and it has perpendicular magnetic anisotropy. As the metal film HLb, a Ta film, a TaN film, or the like can be used. The upper metal film HLb is effective for preventing the ferromagnetic film HLa from being damaged by processing during etching of the magnetic pinned layers HL1 and HL2, while the lower metal film HLb is effective for enhancing adhesion with an interlayer insulating film IL7 or perpendicular magnetic anisotropy of the ferromagnetic film HLa.

The base layer BF is a non-magnetic conductive film formed on the magnetic pinned layers HL1 and HL2. As the base layer BF, for example, a Ta film or TaN film in amorphous form or in not fully crystallized form can be used. This makes it possible to make the data recording layer MR susceptible to the influence of the crystal structure of the tunnel barrier layer TB, provide it with a body centered cubic structure along the crystal plane of the tunnel barrier layer TB, and increase a MR (magneto-resistance) ratio of the magnetic tunnel junction.

The data recording layer MR is a layer that records data as a magnetization direction and is formed on the magnetic pinned layers HL1 and HL2 via the base layer BF. The data recording layer MR is magnetically soft and is configured to have perpendicular magnetic anisotropy. The magnetization of a portion of the data recording layer MR that binds to the magnetic pinned layer HL1 via the base layer BF (which portion will hereinafter be called "magnetic pinned region MR1") is pinned to a direction equal to the magnetization direction of the magnetic pinned layer HL1, while the magnetization of a portion of the data recording layer MR that binds to the magnetic pinned layer HL2 via the base layer BF (which portion will hereinafter be called "magnetic pinned region MR2") is pinned to a direction equal to the magnetization direction of the magnetic pinned layer HL2. In other words, in First Embodiment, the magnetization of the magnetic pinned region MR1 is pinned to the +Z direction and the magnetization of the magnetic pinned region MR2 is pinned to the −Z direction.

The magnetization of a portion of the data recording layer MR between the magnetic pinned region MR1 and the magnetic pinned region MR2 (which portion will hereinafter be called "magnetic free region RM") can be reversed between the +Z direction and the −Z direction. The magnetization direction of the magnetic free region RM is allowed to correspond to data. For example, magnetization of the magnetic free region RM in the −Z direction (downward direction) is allowed to correspond to data "1" and that in the +Z direction (upward direction) is allowed to correspond to data "0".

The data recording layer MR contains Co, Fe, and B. When such a ferromagnetic film containing Co, Fe, and B has a body centered cubic structure and is epitaxially brought into contact with the tunnel barrier layer TB made of an MgO film, the magnetic tunnel junction can have a higher MR ratio. In other words, the data recording layer MR is more preferably made of a CoFeB film as a crystal film having a (100)-oriented body centered cubic structure.

The tunnel barrier layer TB is a thin non-magnetic insulating film formed on the data recording layer MR. The tunnel barrier layer TB contains MgO. When such an insulating film containing MgO has an evaporitic structure, in other words, it has a body centered cubic structure for each of Mg and O, a (100)-oriented MgO film can be formed easily. In other words, the tunnel barrier layer TB is more preferably made of an MgO film as a crystal film having (100)-oriented evaporitic structure.

The data reference layer MP is a layer having pinned magnetization and it covers a portion of the upper surface of the tunnel barrier layer TB. The data reference layer MP has a first ferromagnetic layer MP1, a non-magnetic layer MPr, and a second ferromagnetic layer MP2. The first ferromagnetic layer MP1 and the second ferromagnetic layer MP2 are each magnetically hard and have perpendicular magnetic anisotropy. The non-magnetic layer MPr is a non-magnetic metal film that antiferromagnetically binds the first ferromagnetic layer MP1 to the second ferromagnetic layer MP2. By forming the first ferromagnetic layer MP1 and the second ferromagnetic layer MP2 so as to sandwich therebetween the non-magnetic layer MPr, a magnetic binding force between the first ferromagnetic layer MP1 and the second ferromagnetic layer MP2 can be enhanced and the data reference layer MP can have enhanced coercive force.

By antiferromagnetically binding the first ferromagnetic layer MP1 to the second ferromagnetic layer MP2, the magnetization of the first ferromagnetic layer MP1 and the magnetization of the second ferromagnetic layer MP2 are fixed to directions opposite to each other. Since a leakage magnetic field from both layers is therefore cancelled, the influence of the leakage magnetic field from the data reference layer MP can be reduced. In First Embodiment, the magnetization of the first ferromagnetic layer MP1 is fixed to the +Z direction (upward direction) and the magnetization of the second ferromagnetic layer MP2 is fixed to the −Z direction (downward direction).

As the first ferromagnetic layer MP1, usable is, for example, a film stack obtained by stacking a CoFeB film MP1$a$, an extremely thin Ta film MP1$b$, and a Co/Pt stacked film MP1$c$. The term "Co/Pt stacked film MP1$c$" means a film stack obtained by stacking a thin Co film and a thin Pt film in repetition and the film stack has perpendicular magnetic anisotropy. Using this film stack as the first ferromagnetic layer MP1 enables the first ferromagnetic layer MP1 to have strong perpendicular magnetic anisotropy and have an improved MR ratio. More specifically, a structure having a (100)-oriented bcc CoFeB film MP1$a$ on a (001)-oriented bcc tunnel barrier layer (MgO film) TB is suited for achieving a high MR ratio.

The CoFeB film MP1$a$ is a material likely to have in-plane magnetic anisotropy so that it may pose a problem when the magnetic memory cell MM1 is comprised of a ferromagnetic layer having perpendicular magnetic anisotropy. In order to overcome this problem, a (111)-oriented fcc Co/Pt stacked film MP1$c$ that expresses perpendicular magnetic anisotropy is used. The CoFeB film MP1$a$ can also have perpendicular magnetic anisotropy when the Co/Pt stacked film MP1$c$ that expresses perpendicular magnetic anisotropy is magnetically bound to the CoFeB film MP1$a$.

When the (111)-oriented fcc Co/Pt stacked film MP1$c$ is in direct contact with the CoFeB film MP1$a$, on the other hand, the crystal structure of the Co/Pt stacked film MP1$c$ has an influence on the CoFeB film MP1$a$ at the time of high-temperature heat treatment after formation of the data reference layer MP in the manufacturing step, making it difficult for the tunnel barrier layer (MgO film) TB in contact with the CoFeB film MP1$a$ to have a bcc structure. As a result, a high MR ratio as initially expected cannot be achieved.

The Ta film MP1$b$ plays a role of blocking the continuity of the crystal structure between the (100)-oriented bcc CoFeB film MP1$a$ and the (111)-oriented fcc Co/Pt stacked film MP1$c$. The Ta film MP1$b$ is grown as an intermediate layer having an amorphous phase so that it prevents, in the high-temperature heat treatment, the fcc crystal orientation from spreading from the Co/Pt stacked film MP1$c$ to the CoFeB film MP1$a$. This enables the tunnel barrier layer (MgO film) TB and the CoFeB film MP1$a$ to have a good bcc structure, leading to effective improvement in an MR ratio.

As the second ferromagnetic layer MP2, for example, a Co/Pt stacked film can be used. The Co/Pt stacked film is a film stack obtained by stacking a thin Co film and a thin Pt film in repetition and it has perpendicular magnetic anisotropy. As the non-magnetic layer MPr, for example, a Ru film can be used.

The cap layer CL is a metal layer formed on the data reference layer MP and it protects the data reference layer MP. As the cap layer CL, for example, a film stack (Ta/Pt/Ru/Pt/Ru/Pt stacked film) obtained by stacking a Ta film, a Pt film, a Ru film, a Pt film, a Ru film, and a Pt film one after another in order of mention can be used.

In the magnetic memory cell MM1, the base layer BF, the data recording layer MR, and the tunnel barrier layer TB overlap with each other while having the same shape. The data recording layer MR has, at the center portion thereof, the magnetic free region RM and the magnetic free region RM has, on one side thereof, the magnetic pinned region MR1 and, on the other side, the magnetic pinned region MR2. In plan view, the magnetic pinned region MR1 of the data recording layer MR embraces the magnetic pinned layer HL1 therein and the magnetic pinned region MR2 of the data recording layer MR embraces the magnetic pinned layer HL2 therein. Further, the data reference layer MP and the cap layer CL overlap with each other while having the same shape and in plan view, the magnetic free region RM of the data recording layer MR embraces the data reference layer MP. In the magnetic memory cell MM1, therefore, in plan view, the magnetic pinned layers HL1 and HL2 and the data reference layer MP are embraced in the data recording layer MR or the tunnel barrier layer TB.

Further, a first insulating film IF1 lies in contact with the upper surface of the tunnel barrier layer TB having no data reference layer MP thereon and the respective side walls of the data reference layer MP and the cap layer CL. The first insulating film IF1 is preferably an oxygen-free insulating film in order to prevent oxidation of a metal film and the like that configure the data reference layer MP and the cap layer CL and for example, an $Si_3N_4$ film, an SiCN film, or the like can be used. The first insulating film IF1 however does not lie on the respective side walls of the base layer BF, the tunnel barrier layer TB, and the data recording layer MR.

Further, a second insulating film IF2 lies right above the upper surface of the tunnel barrier layer TB having no data reference layer MP thereon but outside the respective side walls of the data reference layer MP and the cap layer CL. The second insulating film IF2 is, similar to the first insulating film IF1, not present on the respective side walls of the base layer BF, the tunnel barrier layer, and the data recording layer MR. As the second insulating film IF2, for example, an $SiO_2$ film can be used.

Further, a third insulating film IF3 covers, as well as the first insulating film IF1 and the second insulating film IF2, the base layer BF, the data recording layer MR, the tunnel barrier layer TB, the data reference layer MP, and the cap layer CL. As the third insulating film IF3, for example, an $SiO_2$ film can be used. The first insulating film IF1, the second insulating film IF2, and the third insulating film IF3 configure an interlayer insulating film IL9 that covers the magnetic memory cell MM1.

The interlayer insulating film IL9 has, in the upper surface thereof, a contact hole CH that penetrates the interlayer insulating film IL9 (third insulating film IF3) and reaches the upper surface of the cap layer CL. The contact hole CH has therein a plug PG2 made of a conductive film that fills the contact hole CH. Further, the plug PG2 and the interlayer insulating film IL9 have thereon a wiring M6 electrically coupled to the plug PG2.

Film thickness of each member of the magnetic memory cells MM1 according to First Embodiment is, for example, as follows. The film thickness of the magnetic pinned layers HL1 and HL2 is, for example, from about 20 to 60 nm. The film thickness of the base layer BF is, for example, from about 1 to 5 nm. The film thickness of the data recording layer MR is, for example, from about 0.5 to 2 nm. The film thickness of the tunnel barrier layer TB is, for example, from about 1 to 2 nm. The film thickness of the data reference layer MP is, for example, from about 10 to 20 nm. The film thickness of the cap layer CL is, for example, from about 20 to 70 nm.

<Configuration of Semiconductor Device Having Magnetic Memory Cell>

Figure 3:
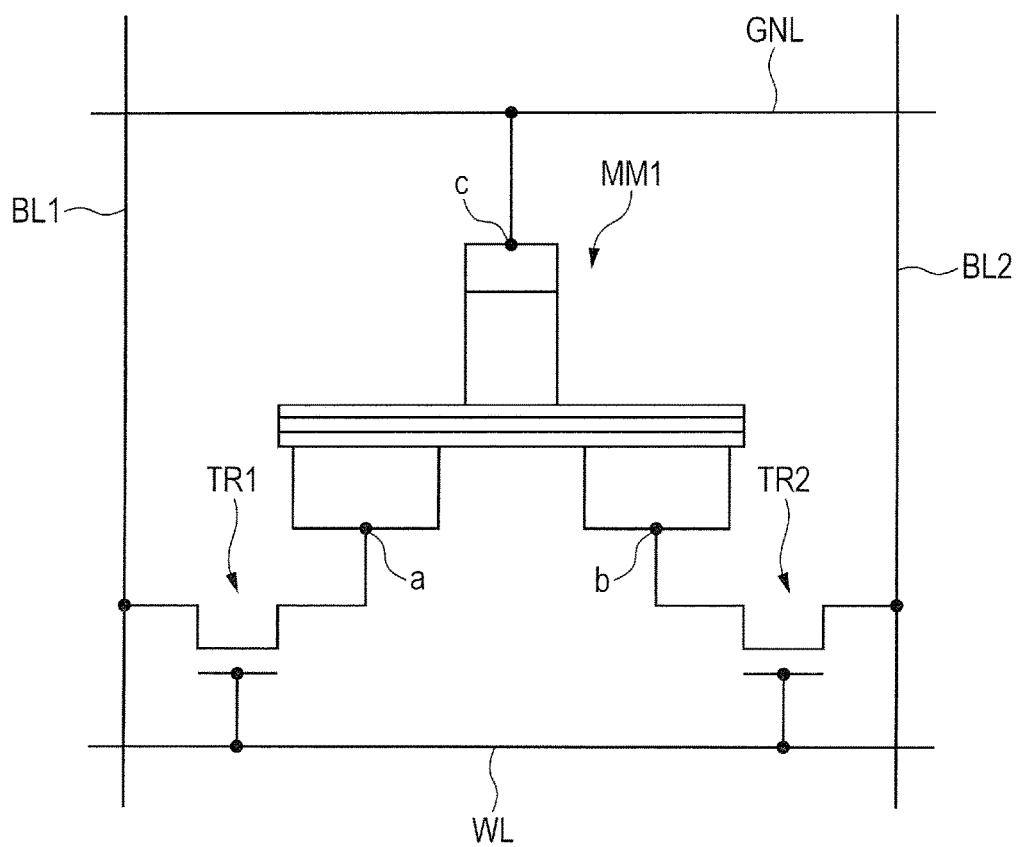
FIG. 3 is a circuit diagram showing the configuration of the semiconductor device having the magnetic memory cell according to First Embodiment.

The configuration of the semiconductor device having the magnetic memory cell according to First Embodiment will next be described referring to FIGS. 2 and 3. FIG. 2 is a fragmentary cross-sectional view showing the semiconductor device having the magnetic memory cell according to First Embodiment. FIG. 3 is a circuit diagram showing the configuration of the semiconductor device having the magnetic memory cell according to First Embodiment.

As shown in FIG. 2, the magnetic memory cell MM1 is coupled in series between two selection transistors TR1 and TR2. Such a configuration is called "2T-1MTJ (2 transistors-1 magnetic tunnel junction) configuration". As shown in FIG. 3, the magnetic memory cell MM1 has, as three terminals thereof, a terminal (a), a terminal (b), and a terminal (c). The terminal (a) is coupled to a bit line BL1 via the selection transistor TR1; the terminal (b) is coupled to a bit line BL2 via the selection transistor TR2; and the terminal (c) is coupled to a ground potential line GNL. The terminal (a) corresponds to the magnetic pinned layer HL1; the terminal (b) corresponds to the magnetic pinned layer HL2; and the terminal (c) corresponds to the data reference layer MP.

The respective gate electrodes of the selection transistors TR1 and TR2 are coupled to the word line WL. A plurality of such magnetic memory cells MM1 is placed at the intersection between a pair of the bit lines BL1 and BL2 and the word line WL and configure a memory cell array.

As shown in FIG. 2, the selection transistors TR1 and TR2 each lie in a region on the main surface of a semiconductor substrate SB, that is, on the upper surface of a p type well PW partitioned by an element isolation region ST. The selection transistors TR1 and TR2 each have, on the semiconductor substrate SB, that is, on the p well PW, a gate electrode GE formed via a gate insulating film GI. The selection transistors TR1 and TR2 each have two semiconductor regions provided in the surface layer portion of the semiconductor substrate SB, that is, in the surface layer portion of the p well PW located on both sides of the gate electrode GE in plan view. One of the two semiconductor regions SD functions as a source region and the other region functions as a drain region. The gate electrode GE has, on the side wall thereof, a sidewall film SW and these two semiconductor regions SD each have a so-called LDD (lightly doped drain) structure. The two semiconductor regions SD have, on the surface layer portion thereof, a metal silicide layer SL for reducing the resistance such as diffusion resistance and contact resistance.

The selection transistors TR1 and TR2 are each coupled to the magnetic memory cell MM1, for example, via a plug PG1, a wiring M1, a via portion V1, a wiring M2, a via portion V2, a wiring M3, a via portion V3, a wiring M4, a via portion V4, a wiring M5, and a via portion V5. The plug PG1, the wiring M1, the via portion V1, the wiring M2, the via portion V2, the wiring M3, the via portion V3, the wiring M4, the via portion V4, the wiring M5, and the via portion V5 are present in the interlayer insulating films IL1 to IL7.

More specifically, one of the two semiconductor regions SD of the selection transistor TR1 is coupled to the magnetic pinned layer HL1 of the magnetic memory cell MM1, for example, via the plug PG1, the wiring M1, the via portion V1, the wiring M2, the via portion V2, the wiring M3, the via portion V3, the wiring M4, the via portion V4, the wiring M5, and the via portion V5. One of the two semiconductor regions SD of the selection transistor TR2 is coupled to the magnetic pinned layer HL2 of the magnetic memory cell MM1, for example, via the plug PG1, the wiring M1, the via portion V1, the wiring M2, the via portion V2, the wiring M3, the via portion V3, the wiring M4, the via portion V4, the wiring M5, and the via portion V5. FIG. 2 shows an arrangement example of the magnetic memory cell MM1 on the via portion V5. The magnetic memory cell MM1 is however not necessarily placed on the via portion V5, but may be placed on the plug, each of the wirings, or each of the via portions.

The other semiconductor region SD, of the two semiconductor regions SD of the selection transistor TR1 is coupled to a wiring M1 which will be a bit line BL1, for example, via the plug PG1. The other semiconductor region SD of the two semiconductor regions SD of the selection transistor TR2 is coupled to a wiring M1 which will be a bit line BL2, for example, via the plug PG1.

The magnetic pinned layer HL1 lies on one of the via portions V5 buried in the interlayer insulating film IL7 and is electrically coupled to this via portion V5. The magnetic pinned layer HL2 lies on another via portion V5 buried in the interlayer insulating film IL7 and is electrically coupled to this via portion V5. The interlayer insulating film IL7 has thereon an interlayer insulating film IL8 that covers therewith the via portion V5. The interlayer insulating film IL8 has a planarized upper surface and the magnetic pinned layers HL1 and HL2 are each exposed from the planarized upper surface of the interlayer insulating film IL8.

Further, the interlayer insulating film IL8 has thereon the magnetic memory cell MM1 comprised of the base layer BF, the data recording layer MR, the tunnel barrier layer TB, the data reference layer MP (comprised of the first ferromagnetic layer MP1, the non-magnetic layer MPr, and the second ferromagnetic layer MP2), the cap layer CL, and the like. These layers are covered by an interlayer insulating film IL9. The interlayer insulating film IL9 has therein a contact hole CH penetrating the interlayer insulating film IL9 and reaching the upper surface of the cap layer CL. The contact hole CH has therein a plug PG2 made of a conductive film with which the contact hole CH is filled. Further, the plug PG2 has thereon a wiring M6 and the wiring M6 has thereon a wiring M7.

<Operation of Magnetic Memory Cell>

Figure 4A:
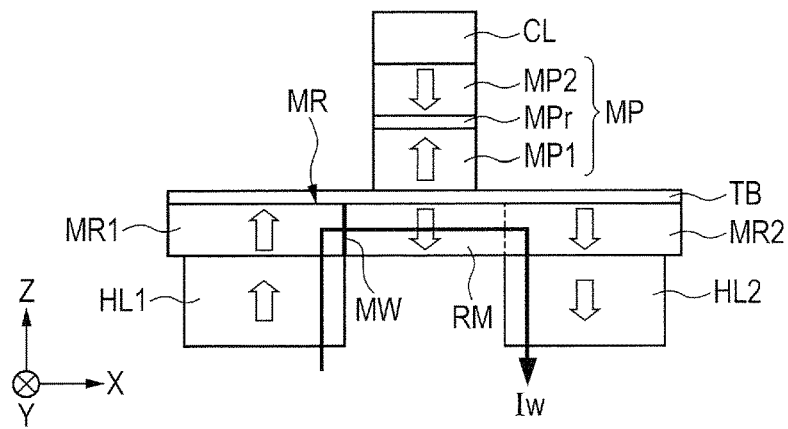
Figure 4B:
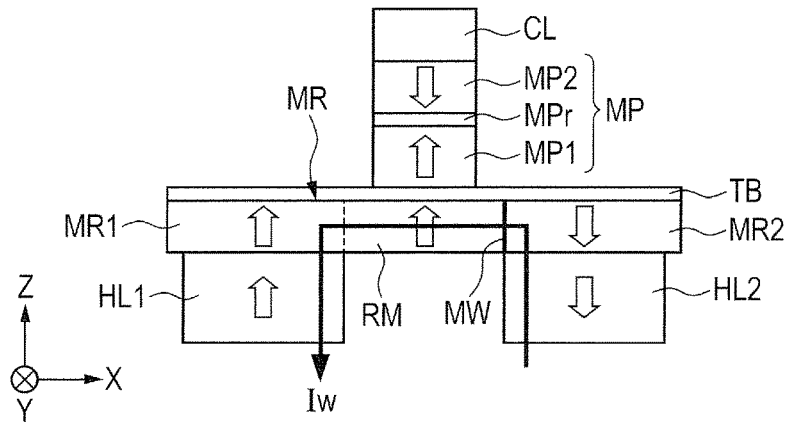
Figure 4C:
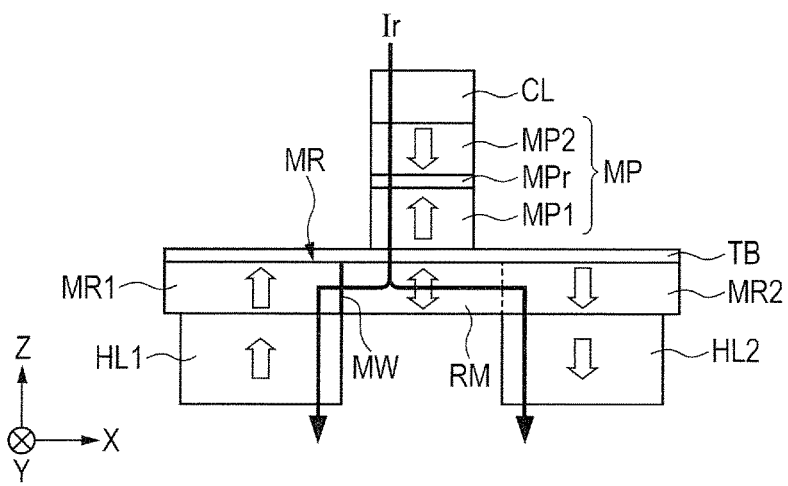

Operation of the magnetic memory cell of First Embodiment will next be described referring to FIGS. 4A, 4B, and 4C. FIG. 4A is a schematic view of the magnetic memory cell of First Embodiment for describing the write operation of data "1" into the magnetic memory cell. FIG. 4B is a schematic view of the magnetic memory cell of First Embodiment for describing the write operation of "data 0" into the magnetic memory cell. FIG. 4C is a schematic view of the magnetic memory cell of First Embodiment for describing the data read operation from the magnetic memory cell.

In the magnetic memory cell MM1 shown in FIG. 1, the magnetic free region RM of the data recording layer MR, the tunnel barrier layer TB, and the first ferromagnetic layer MP1 of the data reference layer MP configure a magnetic tunnel junction. The resistance value of the magnetic tunnel junction varies according to the relative magnetization directions of the magnetic free region RM and the first ferromagnetic layer MP1. When the magnetic free region RM is directed to a direction equal to that of the first ferromagnetic layer MP1, that is, the +Z direction (upward direction), the magnetic tunnel junction has relatively reduced resistance. On the other hand, the magnetic free region RM is directed to a direction opposite to that of the first ferromagnetic layer MP1, that is, the −Z direction (downward direction), the magnetic tunnel junction has relatively increased resistance.

Data are written into the magnetic memory cell MM1 by allowing a write current that passes through the magnetic free region RM to flow between the magnetic pinned regions MR1 and MR2. For example, supposing that the magnetization of the magnetic free region RM in the −Z direction (downward direction) is corresponded to data "1" and the magnetization in the +Z direction (upward direction) is corresponded to data "0". In this case, as shown in FIG. 4A, data "1" is written by allowing a write current Iw to flow from the magnetic pinned region MR1 to the magnetic pinned region MR2 via the magnetic free region RM. Then, spin polarized electrons are injected from the magnetic pinned region MR2 to the magnetic free region RM and by these spin polarized electrons, a magnetic domain wall MW transfers to a boundary between the magnetic pinned region MR1 and the magnetic free region RM. The magnetization of the magnetic free region RM is then directed to a direction equal to that of the magnetic pinned region MR2, that is, the −Z direction. In such a manner, data "1" is written.

As shown in FIG. 4B, on the other hand, data "0" is written by injecting a write current IW from the magnetic pinned region MR2 to the magnetic pinned region MR1 via the magnetic free region RM. Then, spin polarized electrons are injected from the magnetic pinned region MR2 to the magnetic free region RM and by these spin polarized electrons, the magnetic domain wall MW transfers to a boundary between the magnetic pinned region MR2 and the magnetic free region RM. The magnetization of the magnetic free region RM is then directed to a direction equal to that of the magnetic pinned region MR1, that is, the +Z direction. In such a manner, data "0" is written. The write current Iw can be caused to flow, for example, by applying a voltage between the magnetic pinned layers HL1 and HL2.

On the other hand, data is read from the magnetic memory cell MM1 by, as shown in FIG. 4C, allowing a read current Ir to flow through a magnetic tunnel junction comprised of the magnetic free region RM, the tunnel barrier layer TB, and the first ferromagnetic layer MP1. Since the resistance value of the magnetic tunnel junction varies according to the relative magnetization directions of the magnetic free region RM and the first ferromagnetic layer MP1, that is, according to data written into the magnetic memory cell MM1, the data written into the magnetic memory cell MM1 can be discriminated by detecting a change in the resistance value of the magnetic tunnel junction. The data written into the magnetic memory cell MM1 may be discriminated, for example, by grounding the magnetic pinned layers HL1 and HL2, applying a predetermined voltage to the cap layer CL, and detecting the magnitude of the read current Ir that flows therethrough at this time. Data written into the magnetic memory cell MM1 may be discriminated by allowing a predetermined read current Ir to flow through a wiring (read wiring) coupled to the cap layer CL and detecting the potential of the wiring.

<Method of Manufacturing Semiconductor Device>

Figure 5:
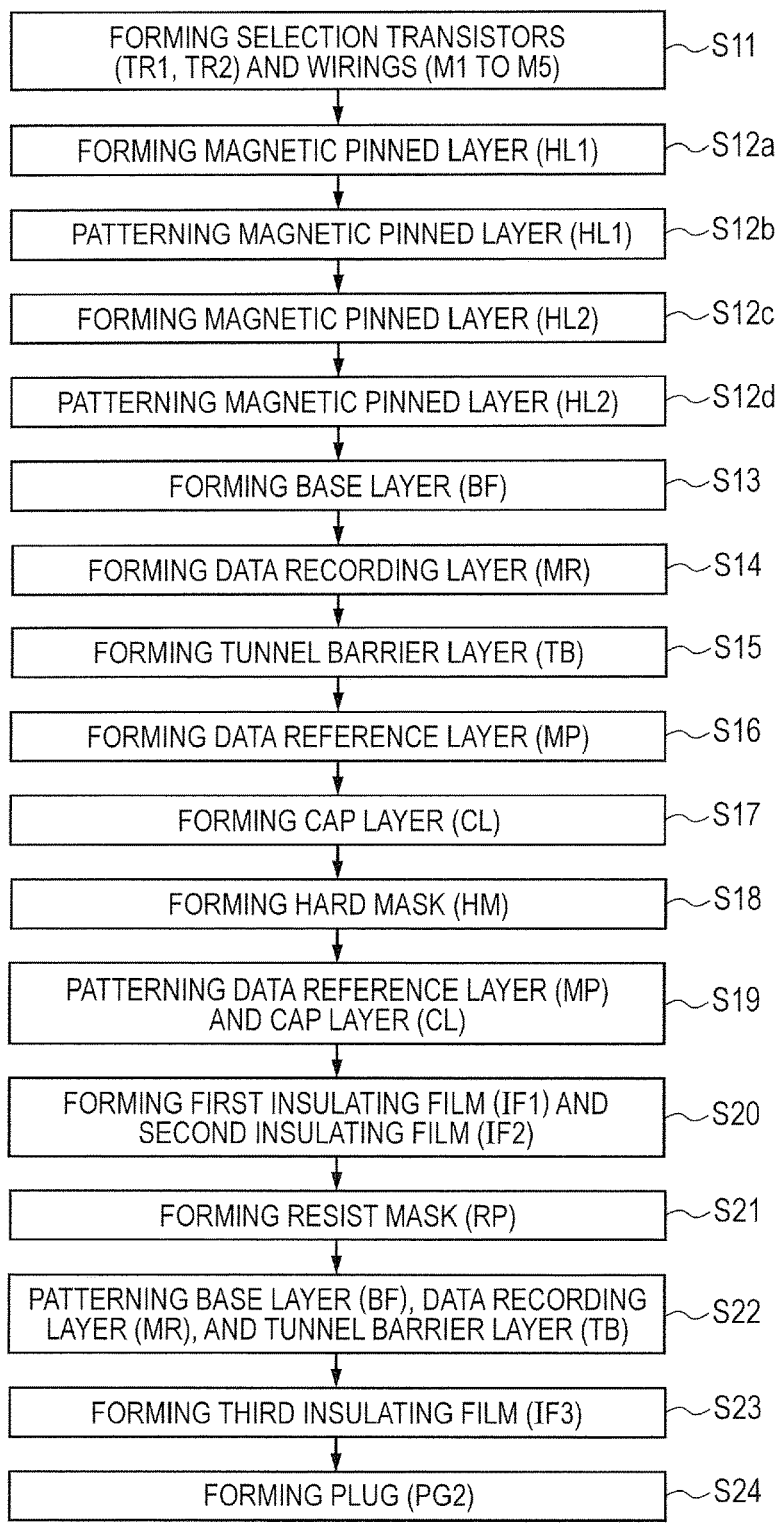
FIG. 5 is a process flow chart showing some manufacturing steps of the semiconductor device according to First Embodiment.
Figure 6:
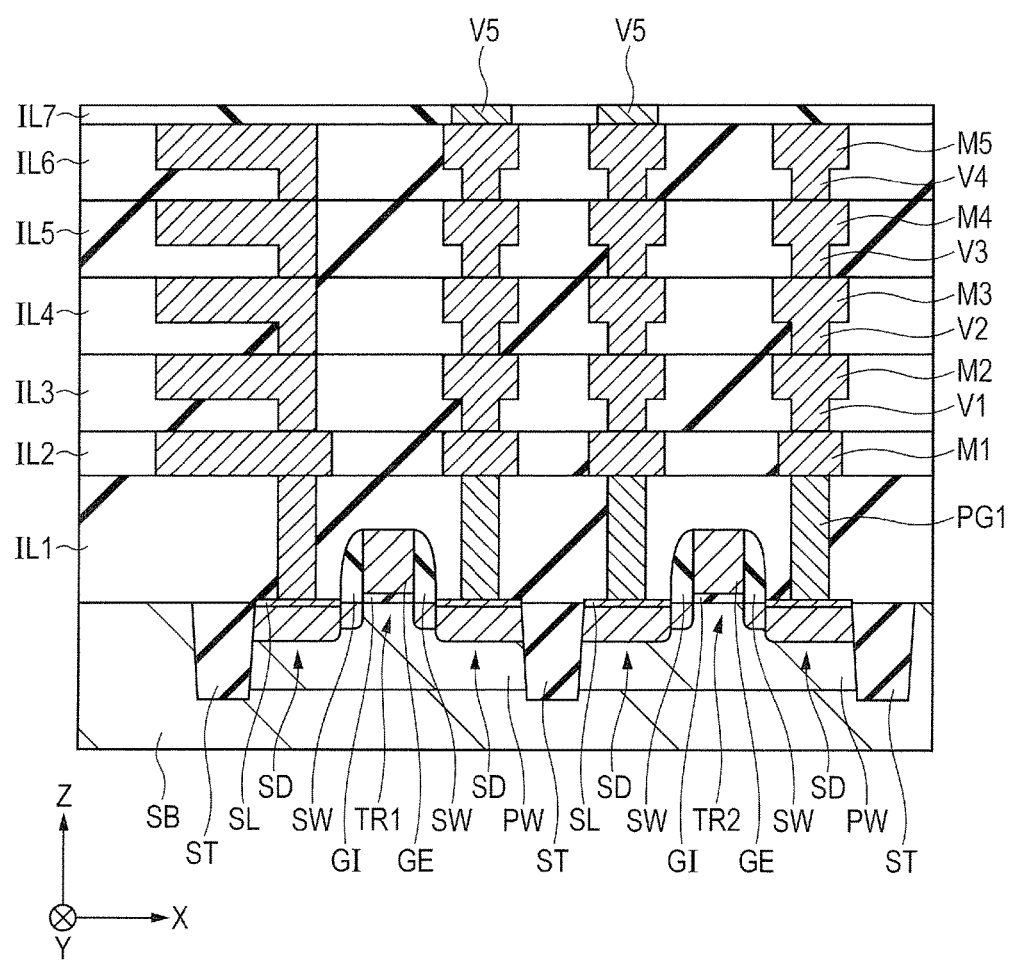
FIG. 6 is a fragmentary cross-sectional view showing a manufacturing step of the semiconductor device according to First Embodiment.
Figure 11:
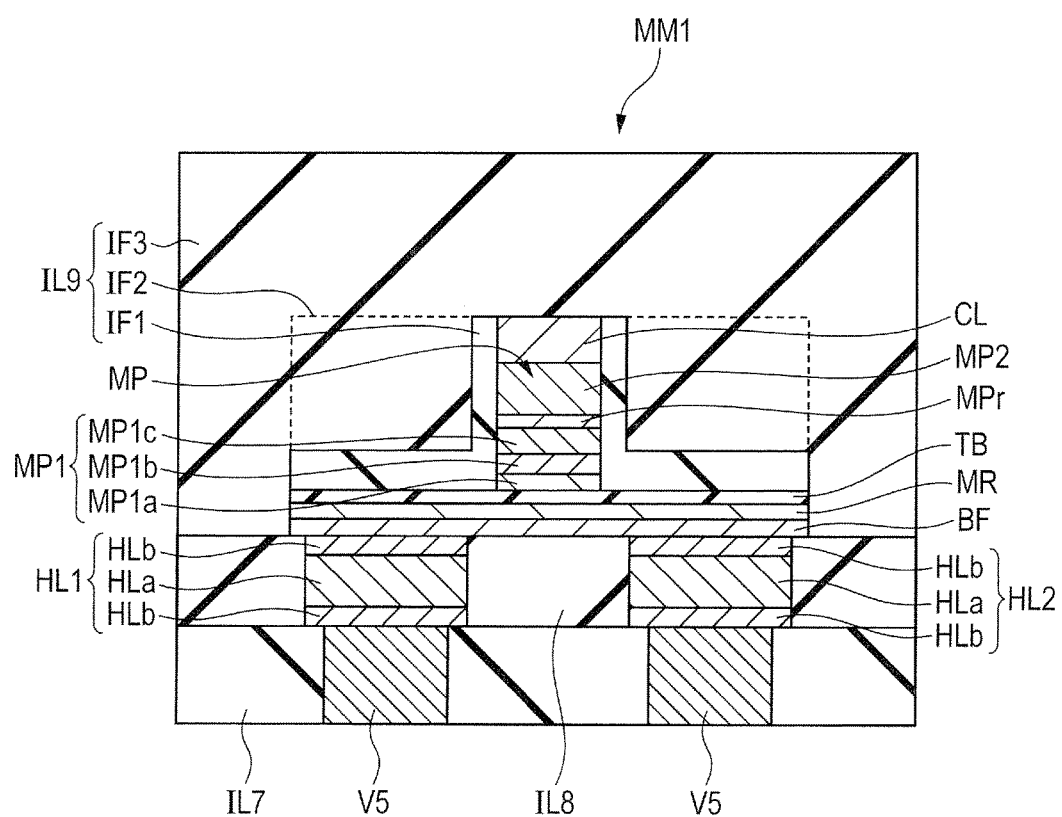
FIG. 11 is a fragmentary cross-sectional view showing a manufacturing step of the semiconductor device following that of FIG. 10.
Figure 12:
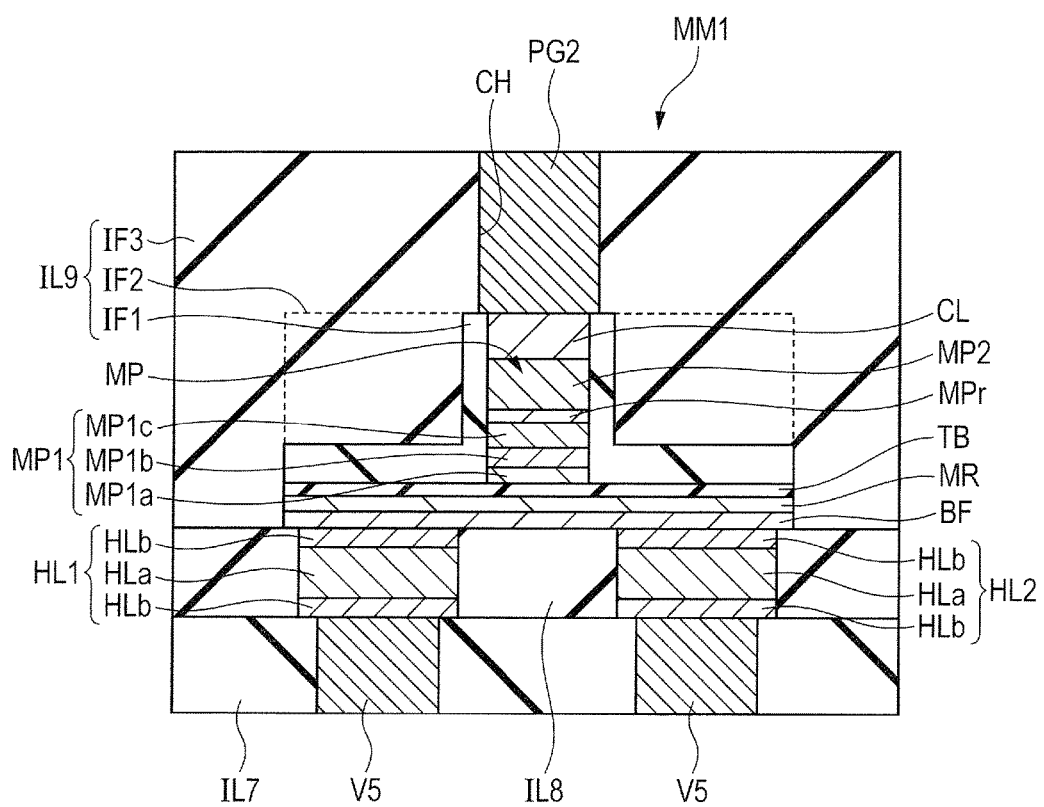
FIG. 12 is a fragmentary cross-sectional view showing a manufacturing step of the semiconductor device following that of FIG. 11.

A method of manufacturing the magnetic memory cell according to First Embodiment will next be described in the order of steps based on FIGS. 5 to 12. FIG. 5 is a process flow chart showing some manufacturing steps of the semiconductor device according to First Embodiment. FIG. 6 is a fragmentary cross-sectional view showing a manufacturing step of the semiconductor device according to First Embodiment. FIGS. 7A to 10A and FIG. 7B to FIG. 10B are respectively fragmentary cross-sectional views and fragmentary plan views showing the manufacturing steps of the semiconductor device according to First Embodiment. FIGS. 11 and 12 are respectively fragmentary cross-sectional views showing manufacturing steps of the semiconductor device according to First Embodiment. FIGS. 7 to 12 are enlarged views of a region having therein the magnetic memory cell.

First, as shown in FIG. 6, two selection transistors TR1 and TR2 are formed on the main surface of a semiconductor substrate SB. Then, a plurality of wirings, more specifically, wirings M1 to M5 are formed above the selection transistors TR1 and TR2 (Step S11 of FIG. 5). Although no limitation is imposed on the formation method of them, they can be formed, for example, by the following steps.

First, a semiconductor substrate SB is provided and an element isolation region ST is formed in the main surface of it. By this element isolation region ST, active regions are partitioned and in these active regions, selection transistors TR1 and TR2 are formed. Here, an n channel MISFET (metal insulator semiconductor field effect transistor) is described as an example, but a p channel MISFET having a reverse conductivity type may be formed as a semiconductor element. Both the n channel MISFET and the p channel MISFET may be formed, instead.

After formation of a p well PW in the active region of the semiconductor substrate SB, a gate electrode GE is formed on the main surface of the semiconductor substrate SB via a gate insulating film GI. After formation of a lightly doped n type semiconductor region by ion implantation, a sidewall film SW is formed on the side wall of the gate electrode GE and further, a highly doped n$^+$ type semiconductor region is formed by ion implantation. As a result, a semiconductor region with an LDD structure that functions as a source region or a drain region is formed.

By the above-described steps, the selection transistors TR1 and TR2 can be formed on the main surface of the semiconductor substrate SB.

After formation of an interlayer insulating film IL1 on the main surface of the semiconductor substrate SB, a plug PG1 is formed in the interlayer insulating film IL1. Wirings M1 of a first layer are then formed by the single damascene process. Wirings M2 and via portions V1 of a second layer, wirings M3 and via portions V2 of a third layer, wirings M4 and via portions V3 of a fourth layer, and wirings M5 and via portions V4 of a fifth layer are then formed by the single damascene process or dual damascene process. FIG. 6 shows the wirings M2, M3, M4, and M5 formed by the dual damascene process. Via portions V5 are then formed by the single damascene process. The wirings M1, M2, M3, M4, and M5 are made using, for example, Cu as a main conductive material. The material is not limited to it, but can be selected from various materials if necessary.

The wirings M1, M2, M3, M4, and M5 can be formed on the main surface of the semiconductor substrate SB by the above-described steps.

Next, a magnetic memory cell MM1 is formed on an interlayer insulating film IL7 having therein the via portion V5.

Figure 7A:
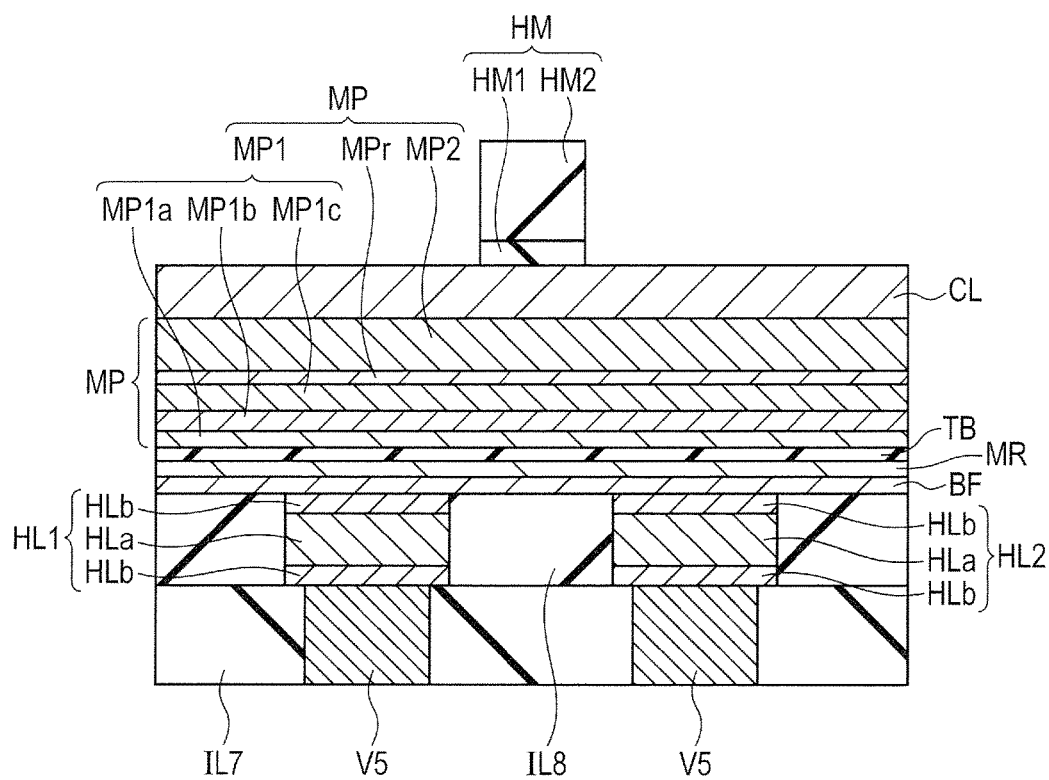
FIGS. 7A and 7B are a fragmentary cross-sectional view and a fragmentary plan view, respectively, showing a manufacturing step of the semiconductor device following that of FIG. 6.
Figure 7B:
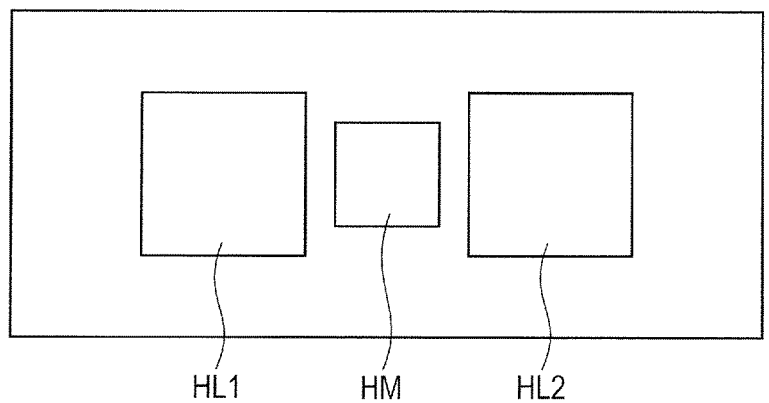

First, as shown in FIGS. 7A and 7B, magnetic pinned layers HL1 and HL2 are formed (Steps S12a to S12d of FIG. 5).

For example, a lower metal film HLb, a ferromagnetic film HLa, and an upper metal film HLb for magnetic pinned layer HL1 are deposited successively on the interlayer insulating film IL7 having therein the via portion V5 by sputtering or the like. The ferromagnetic film HLa is, for example, a Co/Pt stacked film and the upper and lower metal films HLb are each, for example, a Ta film or a TaN film. The Co/Pt stacked film is a film stack obtained by stacking a thin Co film and a thin Pt film in repetition. These stacked films are then patterned to form a magnetic pinned layer HL1. The magnetic pinned layer HL1 has a thickness of, for example, from about 20 to 60 nm.

Further, in a manner similar to that of the magnetic pinned layer HL1, a lower metal film HLb, a ferromagnetic film HLa, and an upper metal film HLb for magnetic pinned layer HL2 are deposited successively on the interlayer insulating film IL7 by sputtering or the like. The ferromagnetic film HLa is, for example, a Co/Pt stacked film and the upper and lower metal films HLb are each, for example, a Ta film or a TaN film. The Co/Pt stacked film is a film stack obtained by stacking a thin Co film and a thin Pt film in repetition. These stacked films are then patterned to form a magnetic pinned layer HL2. The magnetic pinned layer HL2 has a thickness of, for example, from about 20 to 60 nm.

The magnetic pinned layers HL1 and HL2 are respectively formed on the via portions V5 separated from each other. The via portion V5 to be electrically coupled to the magnetic pinned layer HL1 is electrically coupled to one of the semiconductor regions SD of the selection transistor TR1 (refer to FIG. 6). The via portion V5 to be electrically coupled to the magnetic pinned layer HL2 is electrically coupled to one of the semiconductor regions SD of the selection transistor TR2 (refer to FIG. 6).

Next, an interlayer insulating film IL8 is formed on the magnetic pinned layers HL1 and HL2. For example, an insulating film such as Si$_3$N$_4$ film is deposited by CVD (chemical vapor deposition) as the interlayer insulating film IL8, for example, on the magnetic pinned layers HL1 and HL2 and the interlayer insulating film IL7. The surface of the interlayer insulating film IL8 is then removed by CMP (chemical mechanical polishing) or etchback until exposure of the surface of the magnetic pinned layers HL1 and HL2. By this processing, the magnetic pinned layers HL1 and HL2 are buried in the interlayer insulating film IL8 and the upper surface of the magnetic pinned layers HL1 and HL2 are exposed from the upper surface of the interlayer insulating film IL8.

Next, a base layer BF is formed (Step S13 of FIG. 5).

A base layer BF is formed on the interlayer insulating film IL8 having therein the magnetic pinned layers HL1 and HL2. The base layer BF is a non-magnetic conductive film and it is, for example, a Ta film or a TaN film in amorphous form or in not fully crystallized form. The base layer BF has a thickness of, for example, from about 1 to 5 nm.

Next, a data recording layer MR is formed (Step S14 of FIG. 5).

A data recording layer MR is deposited on the base layer BF by sputtering or the like. The data recording layer MR is, for example, a CoFeB film. The base layer BF formed in Step S13 is in amorphous form or in not fully crystallized form. The data recording layer MR formed on the base layer BF in Step S14 is not susceptible to the influence of the crystal structure of the base layer BF. It is, for example, in amorphous form or in not fully crystalized form. The data recording layer MR has a thickness of, for example, from about 0.5 to 2 nm.

Next, a tunnel barrier layer TB is formed (Step S15 of FIG. 5).

A non-magnetic insulating film is then deposited on the data recording layer MR by sputtering or the like. The tunnel barrier layer TB is, for example, an MgO film. The MgO film may be formed by RF sputtering. Alternatively, the MgO film may be formed by forming an Mg film by sputtering and then oxidizing the surface of the Mg film. The above Mg film formation and oxidation may be performed a plurality of times. This Mg film formation and oxidation may be performed in respective chambers (processing chambers) or in one chamber. The tunnel barrier layer TB has a thickness of, for example, from about 1 to 2 nm.

Next, a data reference layer MP is formed (Step S16 of FIG. 5).

For example, a first ferromagnetic layer MP1, a non-magnetic layer MPr, and a second ferromagnetic layer MP2 are deposited successively on the tunnel barrier layer TB by sputtering or the like. The first ferromagnetic layer MP1 is comprised of, for example, a CoFeB film MP1a, a Ta film MP1b, and a Co/P stacked film MP1c. The non-magnetic layer MPr is, for example, an Ru film. The second ferromagnetic layer MP2 is, for example, a Co/Pt stacked film. The Co/Pt stacked film is a film stacked obtained by stacking a thin Co film and a thin Pt film in repetition.

Next, a cap layer CL is formed (Step S17 of FIG. 5).

For example, a non-magnetic conductive film is deposited on the data reference layer MP by sputtering. The cap layer CL is a film stack obtained by stacking a Pt film, an Ru film, a Pt film, an Ru film, a Pt film, and a Ta film in order of mention.

Next, a hard mask HM is formed (Step S18 of FIG. 5).

A hard mask HM for patterning the data reference layer MP and the cap layer CL is formed on the cap layer CL. The hard mask HM is made of a stacked film obtained, for example, by successively depositing an $Si_3N_4$ film HM1 and an $SiO_2$ film HM2. The $Si_3N_4$ film HM1 has a thickness of, for example, about 30 nm and the $SiO_2$ film HM2 has a thickness of, for example about 150 nm.

Figure 8A:
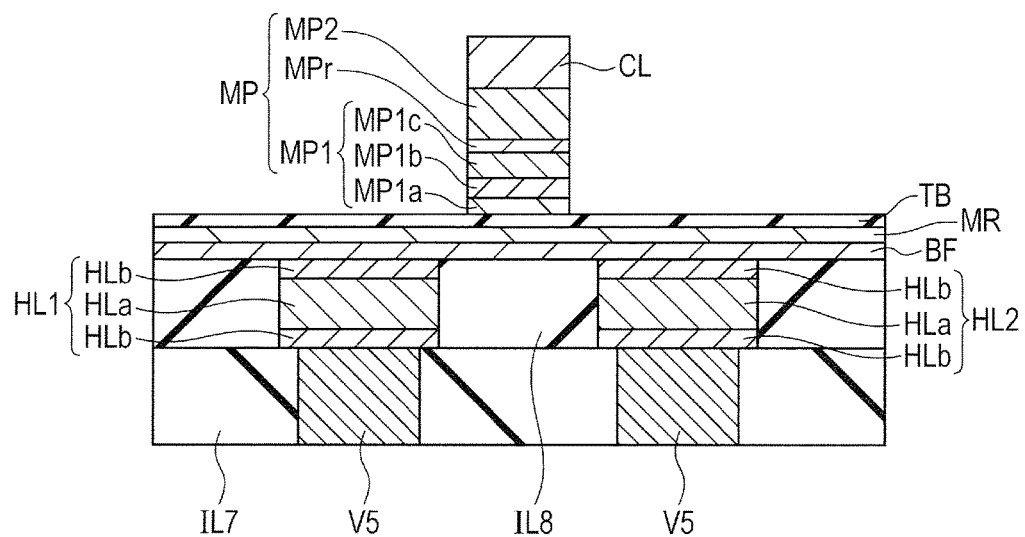
FIGS. 8A and 8B are a fragmentary cross-sectional view and a fragmentary plan view, respectively, showing a manufacturing step of the semiconductor device following that of FIG. 7.
Figure 8B:
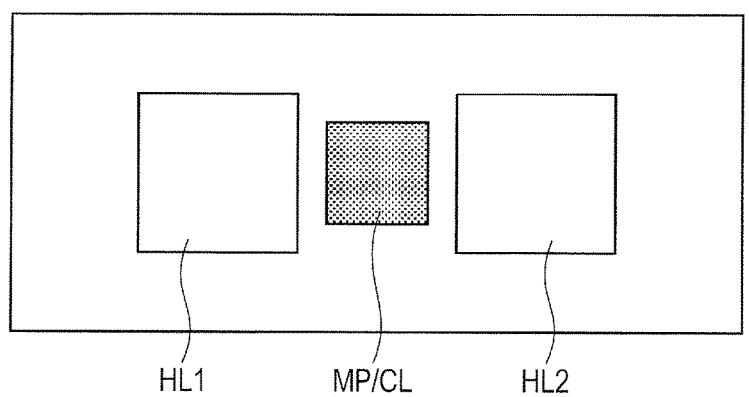

Next, as shown in FIGS. 8A and 8B, the data reference layer MP and the cap layer CL are patterned (Step S19 of FIG. 5).

The cap layer CL and the data reference layer MP are etched successively with the hard mask HM to pattern the data reference layer MP and the cap layer CL so as to leave them between the magnetic pinned layer HL1 and the magnetic pinned layer HL2 in plan view. The hard mask HM is then removed. As a result, a magnetic tunnel junction comprised of the data recording layer MR, the tunnel barrier layer TB, the first ferromagnetic layer MP1 of the data reference layer MP is formed.

Figure 9A:
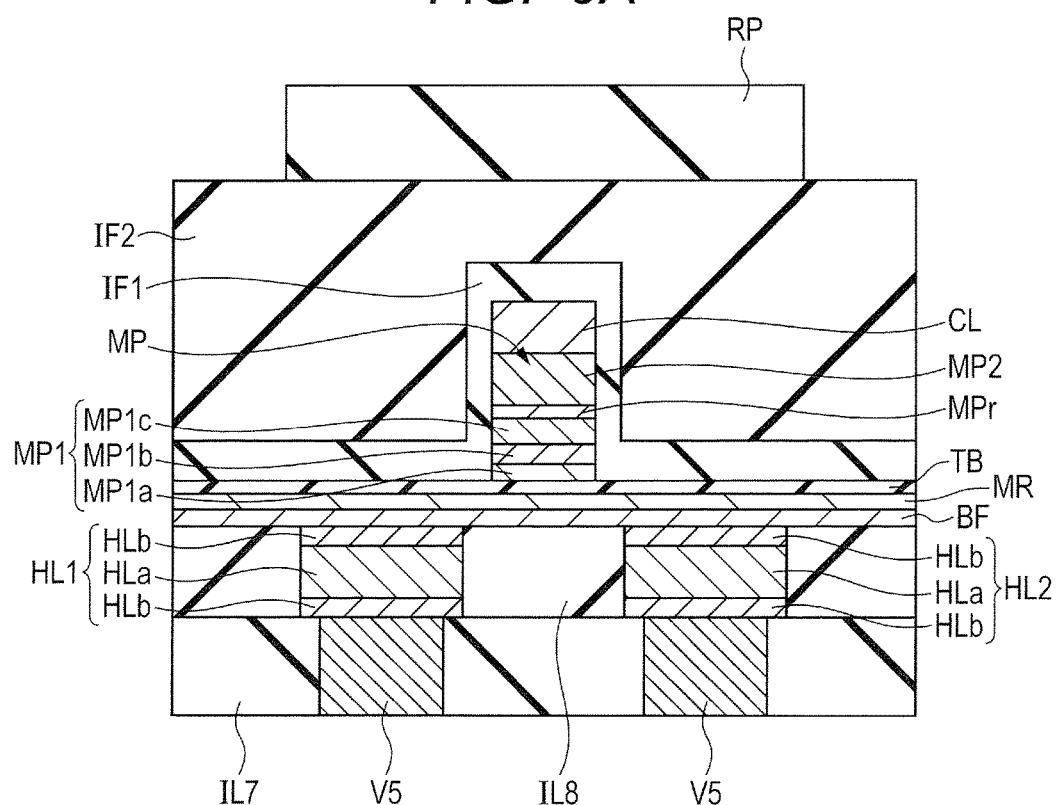
FIGS. 9A and 9B are a fragmentary cross-sectional view and a fragmentary plan view, respectively, showing a manufacturing step of the semiconductor device following that of FIG. 8.
Figure 9B:
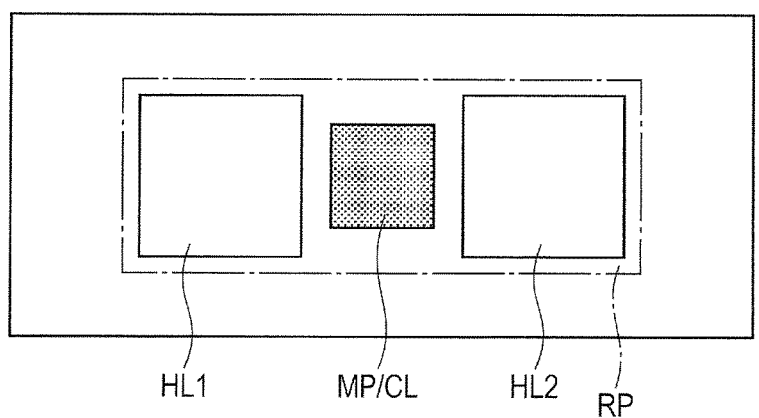

Next, as shown in FIGS. 9A and 9B, a first insulating film IF1 and a second insulating film IF2 are formed (Step S20 of FIG. 5).

A first insulating film IF1 and a second insulating film IF2 are deposited successively on the tunnel barrier layer TB by plasma CVD or the like so as to cover the data reference layer MP and the cap layer CL. As the first insulating film IF1, an oxygen-free insulating film is preferred in order to prevent oxidation of the metal film configuring the data reference film MP and the cap layer CL. It is, for example, an $Si_3N_4$ film or an SiCN film and its film thickness is, for example, about 30 nm. The second insulating film IF2 is, for example, an $SiO_2$ film and its film thickness is, for example, about 250 nm.

A resist mask RP for patterning the base layer BF, the data recording layer MR, and the tunnel barrier layer TB is next formed on the second insulating film IF2 (Step S21 of FIG. 5).

Figure 10A:
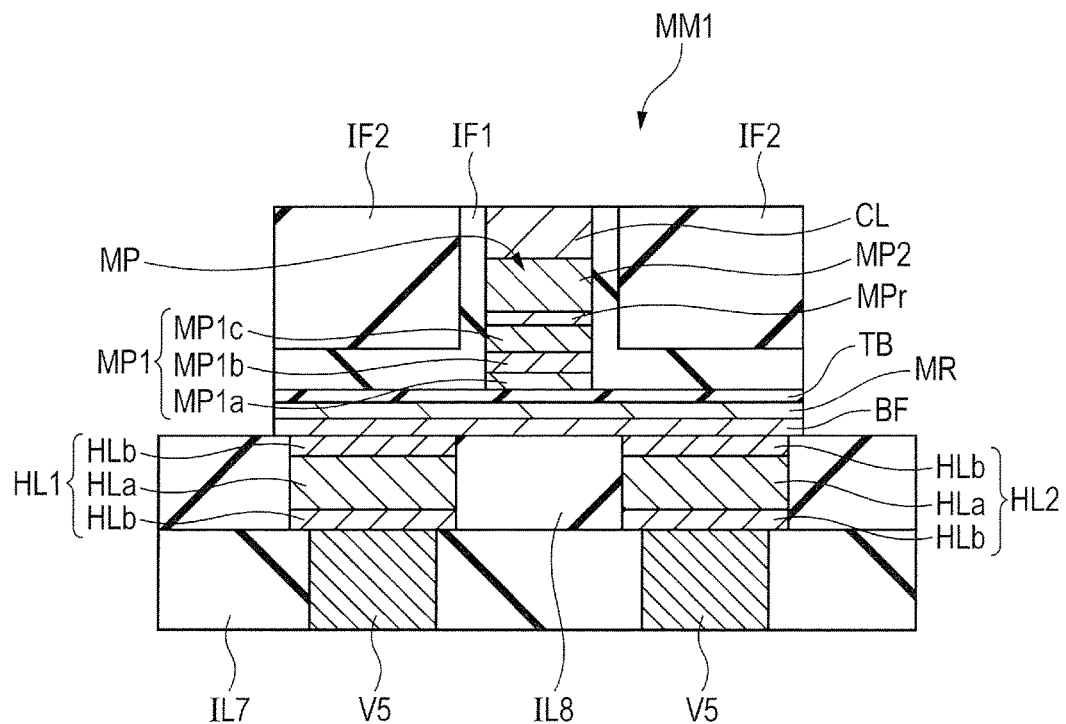
FIGS. 10A and 10B are a fragmentary cross-sectional view and a fragmentary plan view, respectively, showing a manufacturing step of the semiconductor device following that of FIG. 9.
Figure 10B:
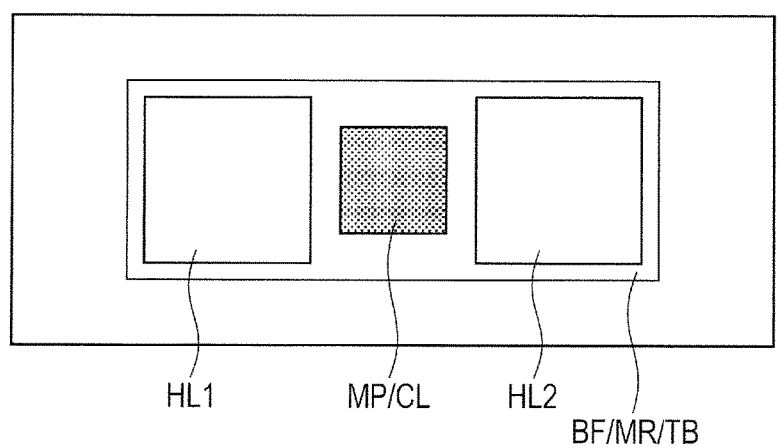

Next, as shown in FIGS. 10A and 10B, the base layer BF, the data recording layer MR, and the tunnel barrier layer TB are patterned (Step S22 of FIG. 5).

The second insulating film IF2, the first insulating film IF1, the tunnel barrier layer TB, the data recording layer MR, and the base layer BF are successively etched using the resist mask RP to pattern the base layer BF, the data recording layer MR, and the tunnel barrier layer TB so as to embrace therein the magnetic pinned layers HL1 and HL2, the cap layer CL, and the data reference layer MP in plan view.

By this etching, the respective side walls of the base layer BF, the data recording layer MR, and the tunnel barrier layer TB are exposed. Different from the above-described Comparative Example, however, the respective side walls of the data reference layer MP and the cap layer CL are covered by the first insulating film IF1 and the second insulating film IF2 so that a metal substance configuring these films such as Pt, Ru, or Ta does not attach to the respective side walls of the base layer BF, the data recording layer MR, and the tunnel barrier TB. A leakage path is therefore not formed between the data reference layer MP and the data recording layer MR via the upper surface and side wall of the tunnel barrier layer TB so that a short failure of the magnetic tunnel junction can be suppressed.

The resist mask RP is then removed. As a result, a magnetic memory cell MM1 is formed.

Next, by CMP or etchback, the upper surface of the second insulating film IF2 is removed until exposure of the first insulating film IF1 on the upper surface of the cap layer CL. Further, by CMP or etchback, the respective upper surfaces of the first insulating film IF1 and the second insulating film IF2 are removed until exposure of the upper surface of the cap layer CL. As a result, the first insulating film IF1 is formed in contact with the upper surface of the tunnel barrier layer TB having no data reference layer MP thereon and the respective side walls of the data reference layer MP and the cap layer CL and the second insulating film IF2 is formed right above the upper surface of the tunnel barrier layer TB having no data reference layer MP thereon and at the same time, outside the respective side walls of the data reference layer MP and the cap layer CL via the first insulating film IF1.

Next, as shown in FIG. 11, a third insulating film IF3 is formed (Step S23 of FIG. 5).

A third insulating film IF3 is deposited by plasma CVD or the like so as to cover, as well as the first insulating film IF1 and the second insulating film IF2, the base layer BF, the data recording layer MR, and the tunnel barrier layer TB, the data reference layer MP, and the cap layer CL. The third insulating film IF3 is, for example, an $SiO_2$ film and its film thickness is, for example, about 540 nm. The upper surface of the third insulating film IF3 is then planarized by CMP or the like. As a result, an interlayer insulating film IL9 is formed, which is comprised of the first insulating film IF1, the second insulating film IF2, and the third insulating film IF3.

Next, as shown in FIG. 12, a plug PG2 is formed (Step S24 of FIG. 5).

A contact hole CH penetrating the interlayer insulating film IL9 (third insulating film IF3) and reaching the upper surface of the cap layer CL is formed and the contact hole is filled with a conductive film. A plug PG2 made of the conductive film with which the contact hole CH has been filled is thus formed.

Although not illustrated here, wirings are then formed on the interlayer insulating film IL9. By the above-described steps, the selection transistors TR1 and TR2, the wirings M1 to M7, and the magnetic memory cell MM1 can be formed as shown in FIG. 2.

Figure 13:
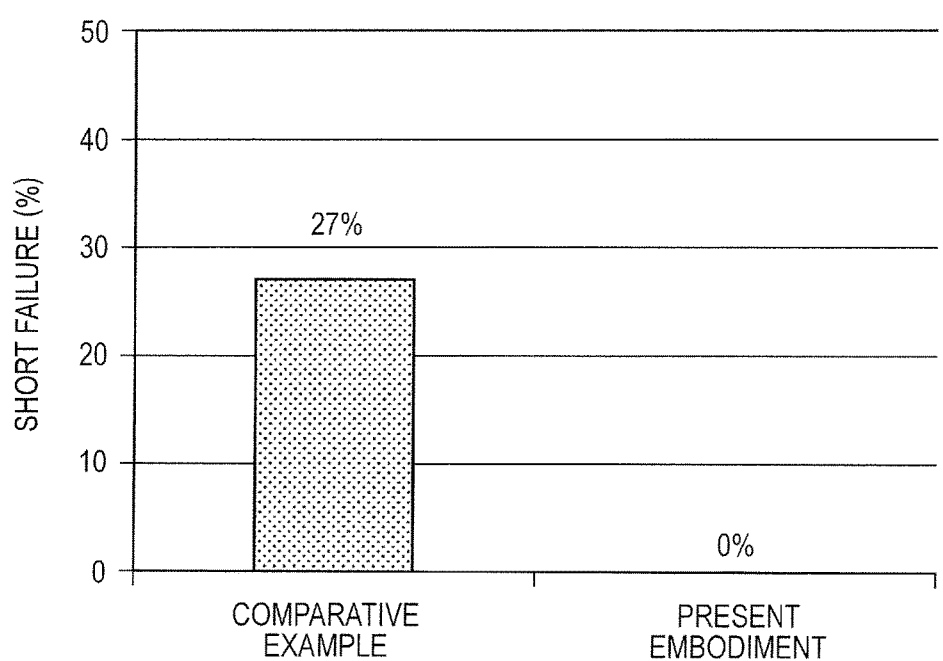
FIG. 13 is a graph showing a short failure percent of each of the magnetic memory cell of First Embodiment and a magnetic memory cell of Comparative Example.

FIG. 13 is a graph showing a short failure percent of the magnetic memory cell according to First Embodiment and the magnetic memory cell of Comparative Example investigated by the present inventors.

As shown in FIG. 13, the magnetic memory cell of Comparative Example exhibits a short failure percent of 27%, while the magnetic memory cell according to First Embodiment exhibits a short failure percent of 0%, suggesting that the magnetic memory cell according to First Embodiment exhibits a markedly reduced short failure percent.

Thus, in First Embodiment, first, the data reference layer MP and the cap layer CL are patterned. After formation of the first insulating film IF1 on the respective side walls of them, the base layer BF, the data recording layer MR, and the tunnel barrier layer TB are patterned. This makes it possible to prevent a metal substance configuring the data reference layer MP and the cap layer CL from attaching to the side wall of the tunnel barrier layer TB so that no leakage path is formed between the data reference layer MP and the data recording layer MR via the upper surface and side wall of the tunnel barrier layer and the resulting magnetic tunnel junction can be inhibited from causing a short failure.

Second Embodiment

A semiconductor device having a magnetic memory cell according to Second Embodiment is almost similar to that of First Embodiment, but is different therefrom in the configuration and manufacturing method of an interlayer insulating film that covers therewith the magnetic memory cell.

<Configuration of Semiconductor Device>

Figure 14:
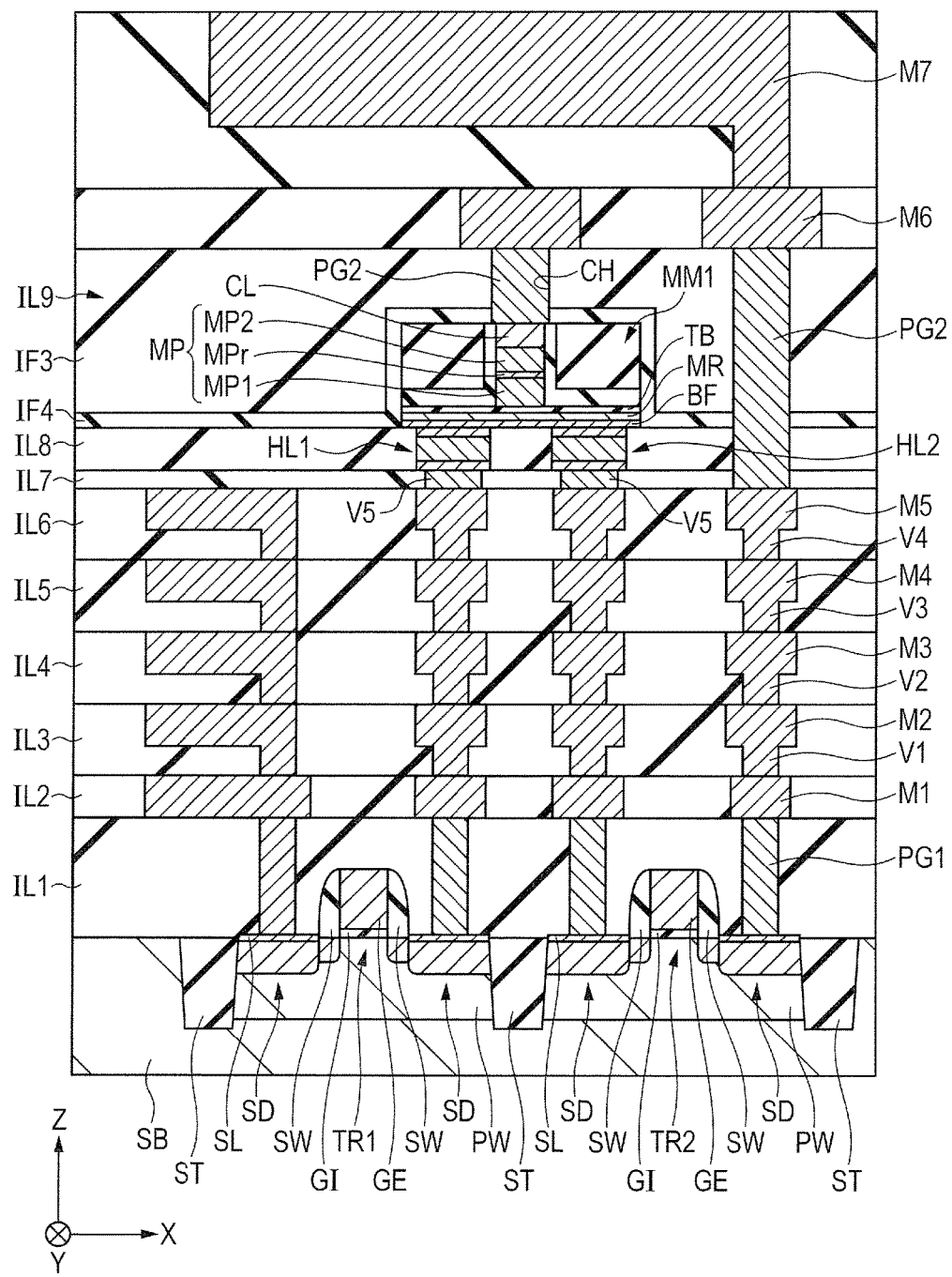
FIG. 14 is a fragmentary cross-sectional view showing a semiconductor device having a magnetic memory cell according to Second Embodiment.

The configuration of the magnetic memory cell according to Second Embodiment will be described referring to FIG. 14. FIG. 14 is a fragmentary cross-sectional view showing the semiconductor device having the magnetic memory cell according to Second Embodiment. The magnetic memory cell according to Second Embodiment has a configuration almost similar to that of the magnetic memory cell of First Embodiment so that difference will be mainly described and description on the other configuration will be omitted.

In First Embodiment, the respective side walls of the base layer BF, the data recording layer MR, and the tunnel barrier layer TB are in contact with the third insulating film IF3 made of, for example, an $SiO_2$ film (refer to FIG. 1).

In Second Embodiment, however, as shown in FIG. 14, the respective side walls of the base layer BF, the data recording layer MR, and the tunnel barrier layer TB are in contact with an oxygen-free fourth insulating film IF4 made of, for example, an $Si_3N_4$ film or SiCN film. Via this fourth insulating film IF4, the third insulating film IF3 made of, for example, an $SiO_2$ film covers therewith the entirety of the magnetic memory cell MM1.

Even when an oxygen-containing film such as $SiO_2$ film is used as the third insulating film IF3, oxidation from the respective side walls of the base layer BF, the data recording layer MR, and the tunnel barrier layer TB can be prevented by covering the respective side walls of the base layer BF, the data recording layer MR, and the tunnel barrier layer TB with the oxygen-free fourth insulating film IF4.

<Method of Manufacturing Semiconductor Device>

Figure 15:
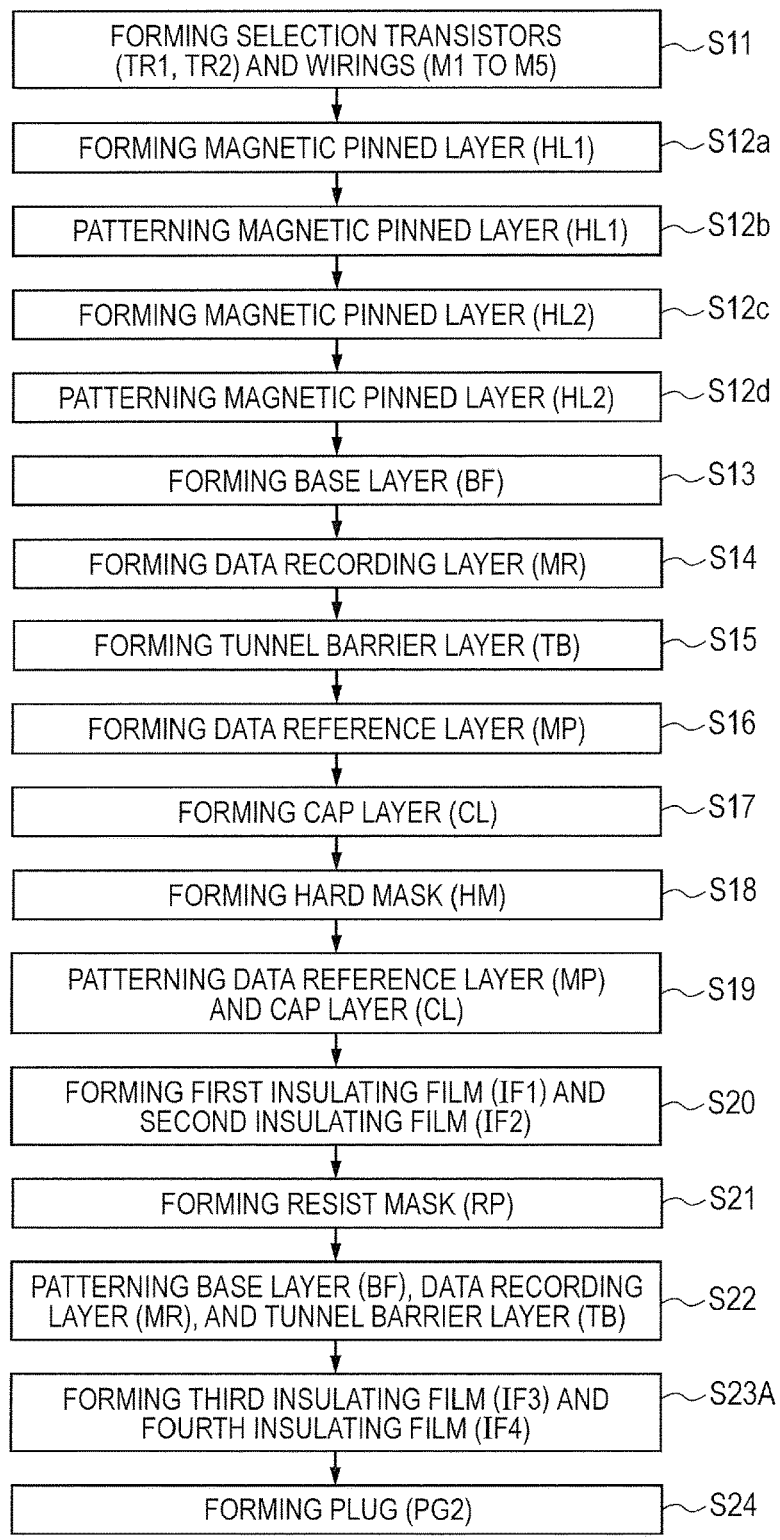
FIG. 15 is a process flow chart showing some manufacturing steps of the semiconductor device according to Second Embodiment.
Figure 16:
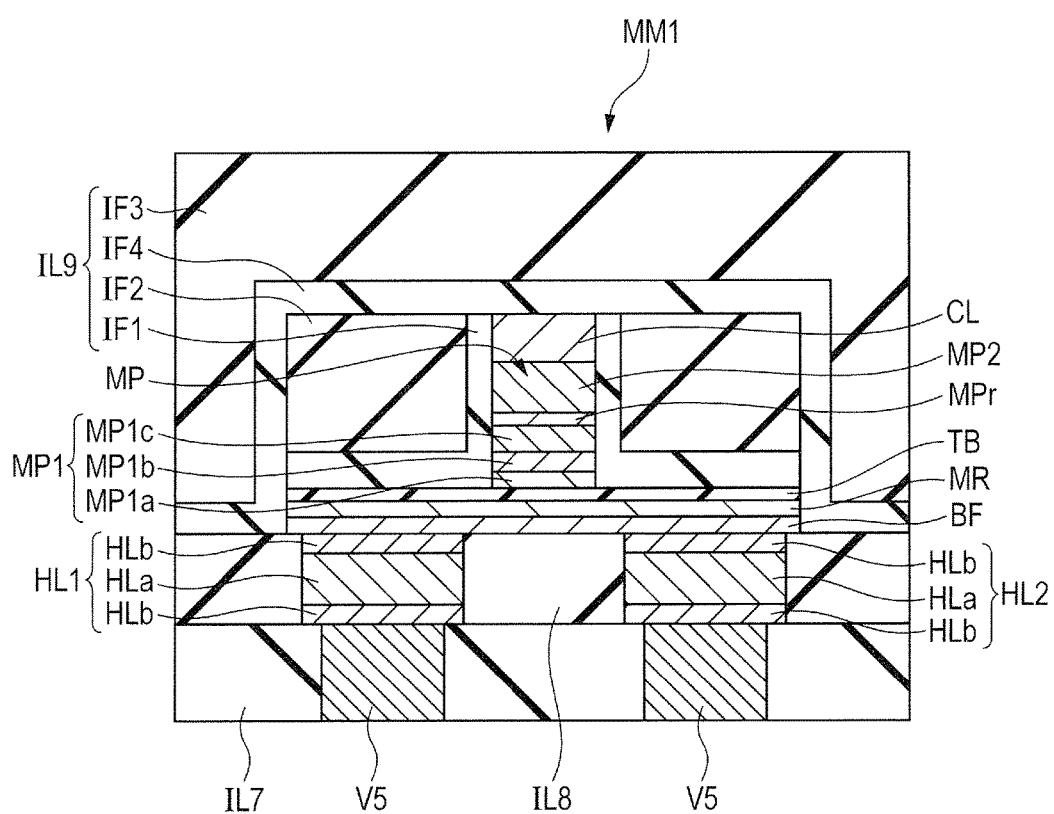
FIG. 16 is a fragmentary cross-sectional view showing a manufacturing step of the semiconductor device according to Second Embodiment.
Figure 17:
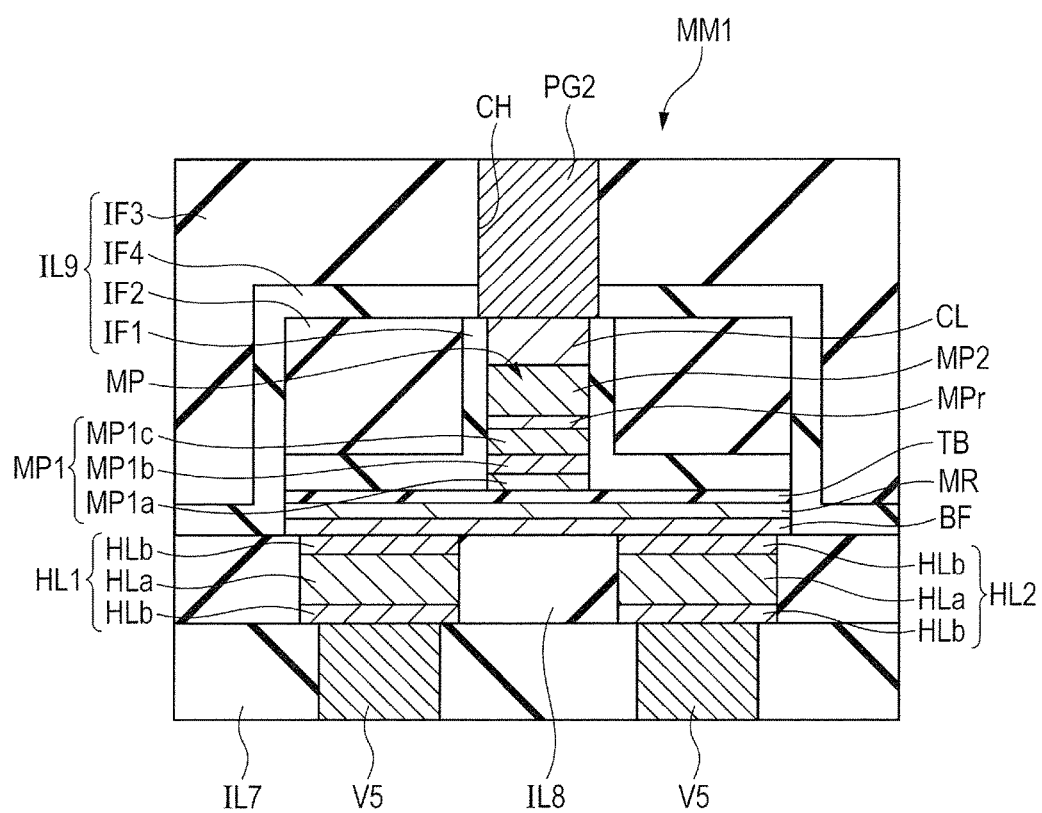
FIG. 17 is a fragmentary cross-sectional view showing a manufacturing step of the semiconductor device following that of FIG. 16.

A method of manufacturing the magnetic memory cell according to Second Embodiment will next be described in the order of steps based on FIGS. 15 to 17. FIG. 15 is a process flow chart showing some manufacturing steps of the semiconductor device according to Second Embodiment. FIGS. 16 and 17 are fragmentary cross-sectional views showing manufacturing steps of the semiconductor device according to Second Embodiment, respectively. FIGS. 16 and 17 are enlarged views of a region in which the magnetic memory cell is formed. Manufacturing procedures until patterning of the base layer BF, the data recording layer MR, and the tunnel barrier layer TB are similar to those of First Embodiment so that a description on them are omitted (refer to Steps S11 to S22 of FIG. 5, refer to FIGS. 8 to 10).

As shown in FIGS. 10A and 10B, a magnetic memory cell MM1 is formed, followed by formation of a first insulating film IF1 and a second insulating film IF2 (Step S20 of FIG. 15).

As described in First embodiment, in Step S21, the side wall of the tunnel barrier layer TB is exposed. In the present embodiment different from Comparative Example, however, the respective side walls of the data reference layer MP and the cap layer CL are covered with the first insulating film IF1 and the second insulating film IF2 so that a metal substance configuring them such as Pt, Ru, or Ta can be prevented from attaching to the respective side walls of the base layer BF, the data recording layer MR, and the tunnel barrier layer TB. No leakage path via the side wall of the tunnel barrier layer TB is therefore formed between the data reference layer MP and the data recording layer MR so that the resulting magnetic tunnel junction can be inhibited from causing a short failure.

Next, as shown in FIG. 16, a fourth insulating film IF4 and a third insulating film IF3 are formed successively (Step S23A of FIG. 15).

A fourth insulating film IF4 and a third insulating film IF3 are deposited successively by plasma CVD or the like so as to cover, as well as the first insulating film IF1 and the second insulating film IF2, the base layer BF, the data recording layer MR, the tunnel barrier layer TB, the data reference layer MP and the cap layer CL. The fourth insulating film IF4 is an oxygen-free film, for example, an $Si_3N_4$ film or an SiCN film and it has a film thickness of, for example, about 30 nm. The third insulating film IF3 is, for example, an $SiO_2$ film and it has a film thickness of, for example, about 540 nm. The upper surface of the third insulating film IF3 is then planarized using CMP or the like. As a result, an interlayer insulating film IL9 comprised of the first insulating film IF1, the second insulating film IF2, the third insulating film IF3 and the fourth insulating film IF4 is formed.

In First Embodiment, only the third insulating film IF3 is formed without forming the fourth insulating film IF4. In this case, when the third insulating film IF3 is comprised of, for example, an oxygen-containing $SiO_2$ film, the data recording layer MR or the base layer BF may be oxidized because they are exposed. Before formation of the third insulating film IF3, therefore, the oxygen-free fourth insulating film IF4 is formed.

Next, as shown in FIG. 17, a plug PG2 is formed (Step S24 of FIG. 15).

A contact hole CH penetrating the interlayer insulating film IL9 (third insulating film IF3 and fourth insulating film IF4) and reaching the upper surface of the cap layer CL is formed. A conductive film is then formed to fill the contact hole CH therewith. As a result, a plug PG2 comprised of the conductive film with which the contact hole CH is filled is formed.

Although not illustrated here, wirings are then formed on the interlayer insulating film IL9. As shown in FIG. 14, selection transistors TR1 and TR2, wirings M1 to M7, and a magnetic memory cell MM1 can be formed by the above-described steps.

In addition to the advantage of First Embodiment, Second Embodiment can suppress oxidation of the respective side walls of the base layer BF, the data recording layer MR, and the tunnel barrier layer TB so that the magnetic memory cell MM1 thus obtained can have improved reliability.

Third Embodiment

A semiconductor device having a magnetic memory cell according to Third Embodiment is almost similar to that of Second Embodiment, but is different from that of Second Embodiment in a method of manufacturing an interlayer insulating film that covers a magnetic memory cell therewith.

<Method of Manufacturing Semiconductor Device>

Figure 18:
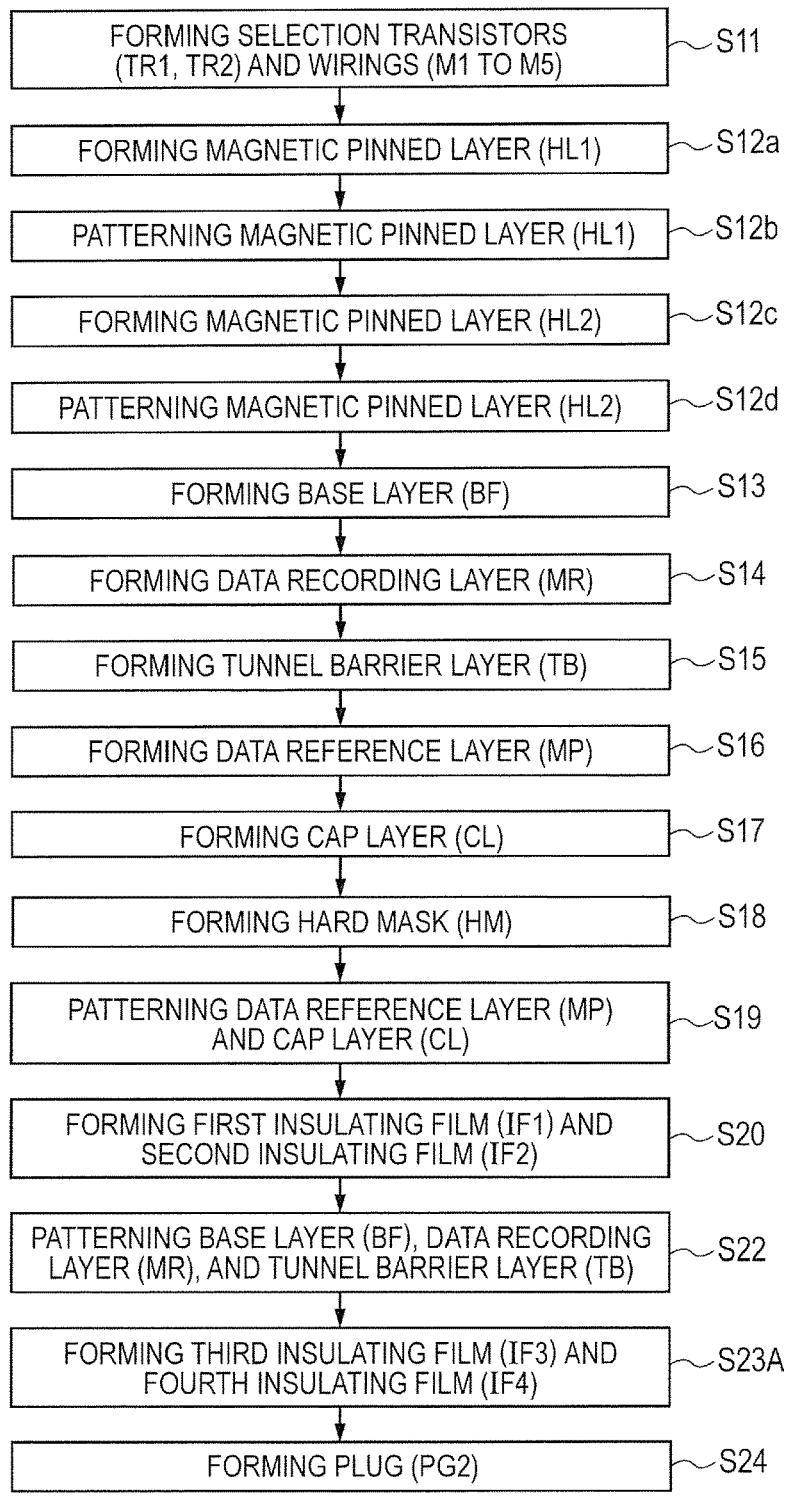
FIG. 18 is a process flow chart showing some manufacturing steps of a semiconductor device according to Third Embodiment.

A method of manufacturing the magnetic memory cell according to Third Embodiment will be described in the order of steps based on FIGS. 18 to 22. FIG. 18 is a process flow chart showing some manufacturing steps of the semiconductor device according to Third Embodiment. FIGS. 19 to 22 are fragmentary cross-sectional views showing manufacturing steps of the semiconductor device according to Third Embodiment. FIGS. 19 to 22 are enlarged views of a region having therein the magnetic memory cell. Manufacturing procedures until patterning of the data reference layer MP and the cap layer CL are similar to those of First Embodiment so that a description on them is omitted (Steps S11 to S19 of FIG. 5, refer to FIGS. 7 and 8).

As shown in FIGS. 8A and 8B, the data reference layer MP and the cap layer CL are patterned (Step S19 of FIG. 18).

Figure 19:
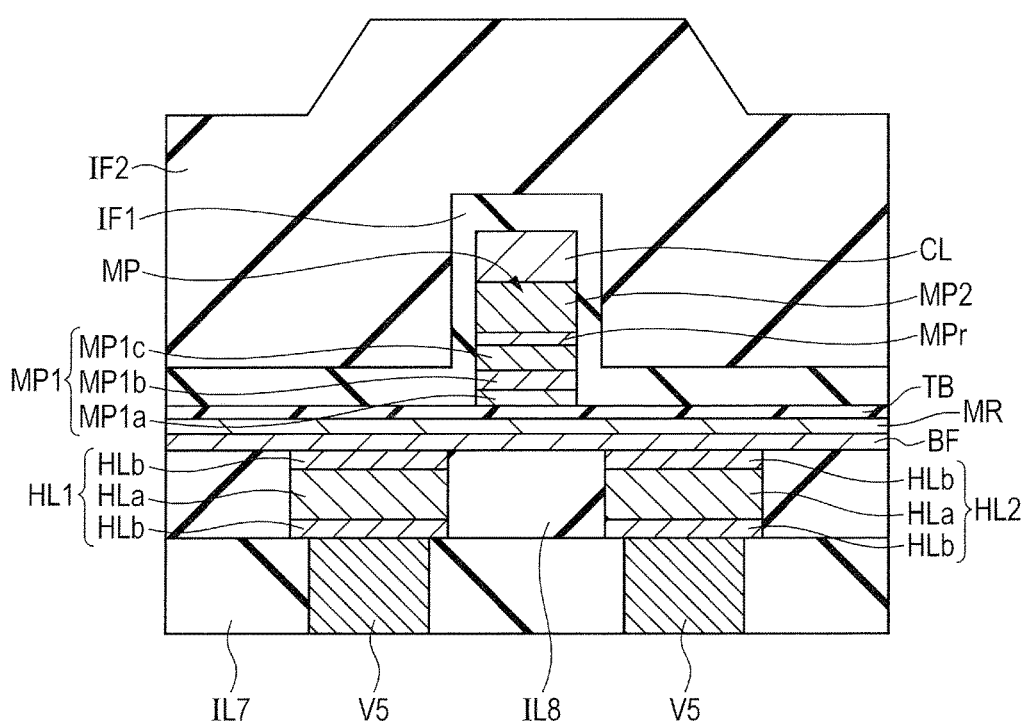
FIG. 19 is a fragmentary cross-sectional view showing a manufacturing step of the semiconductor device according to Third Embodiment.

Next, as shown in FIG. 19, a first insulating film IF1 and a second insulating film IF2 are formed successively (Step S20 of FIG. 18).

A first insulating film IF1 and a second insulating film IF2 are deposited successively on the tunnel barrier layer TB by plasma CVD or the like so as to cover the data reference layer MP and the cap layer CL. As the first insulating film IF1, an oxygen-free insulating film, for example, an $Si_3N_4$ film or an SiCN film is preferred in order to prevent oxidation of the metal film configuring the data reference film MP and the cap layer CL. Its film thickness is, for example, about 30 nm. The second insulating film IF2 is, for example, an $SiO_2$ film and its film thickness is, for example, about 250 nm.

Figure 20:
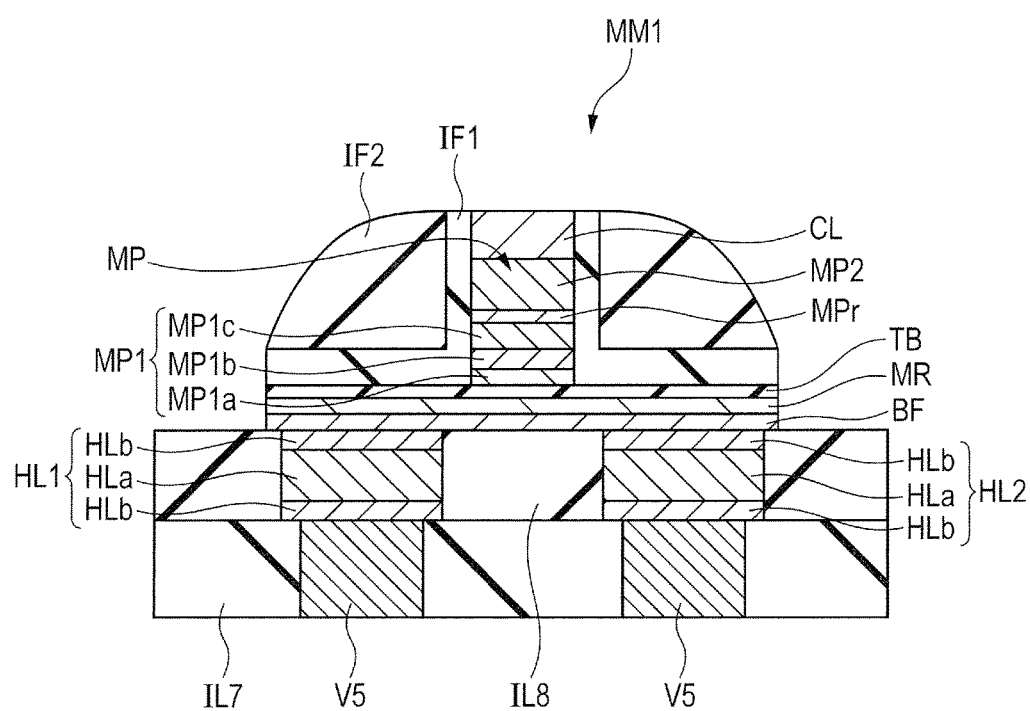
FIG. 20 is a fragmentary cross-sectional view showing a manufacturing step of the semiconductor device following that of FIG. 19.

Next, as shown in FIG. 20, the base layer BF, the data recording layer MR, and the tunnel barrier layer TB are patterned (Step S22 of FIG. 18).

In Second Embodiment, this second insulating film IF2 is formed by etching through a resist mask RP (Step S21 of FIG. 15), while in Third Embodiment, the second insulating film IF2 is processed without using a resist mask. For example, with the first insulating film IF1 as an etching stopper, the second insulating film IF2 is processed by whole-surface etchback using anisotropic dry etching. With the second insulating film IF2 processed into a side wall form as a mask, the first insulating film IF1, the tunnel barrier layer TB, the data recording layer MR, and the base layer BF are successively etched to pattern the base layer BF, the data recording layer MR, and the tunnel barrier layer TB. Third Embodiments does not require formation of a resist mask so that manufacturing TAT and manufacturing cost can be reduced.

In Third Embodiment, processing of the second insulating film IF2 is achieved by performing whole-surface etchback once. Processing is not limited to it. For example, it may be processed by forming a lower insulating film on the first insulating film IF1, processing half of the lower insulating film by etchback, covering it with an upper insulating film inferior in coverage, and etching back the upper insulating film and the lower insulating film again. This makes it possible to widen a difference in coverage between a portion of the film to be processed by etchback and the other portion to be left.

Figure 21:
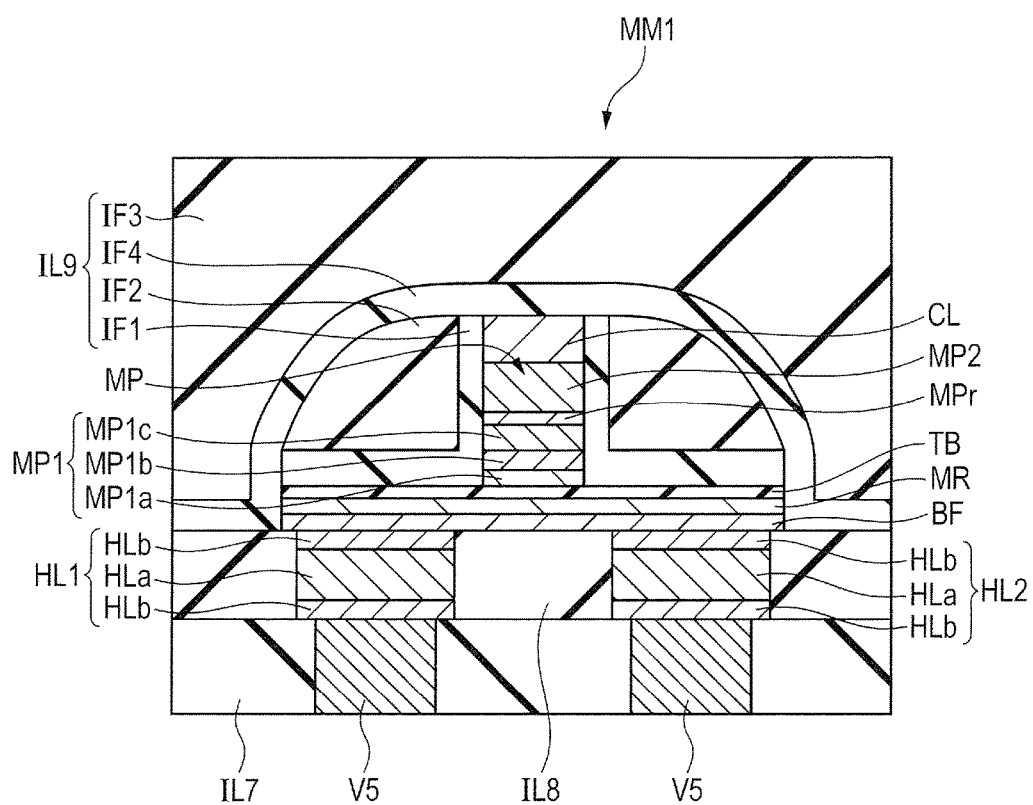
FIG. 21 is a fragmentary cross-sectional view showing a manufacturing step of the semiconductor device following that of FIG. 20.

Next, as shown in FIG. 21, an oxygen-free fourth insulating film IF4 and a third insulating film IF3 are formed successively (Step S23A of FIG. 18).

A fourth insulating film IF4 and a third insulating film IF3 are deposited successively by plasma CVD or the like so as to cover, as well as the first insulating film IF1 and the second insulating film IF2, the base layer BF, the data recording layer MR, the tunnel barrier layer TB, the data reference layer MP, and the cap layer CL. The fourth insulating film IF4 is an oxygen free film, for example, an $Si_3N_4$ film or an SiCN film and its film thickness is, for example, about 30 nm. The third insulating film IF3 is, for example, an $SiO_2$ film and its film thickness is, for example, about 540 nm. The upper surface of the third insulating film IF3 is then planarized by CMP or the like. As a result, an interlayer insulating film IL9 comprised of the first insulating film IF1, the second insulating film IF2, the third insulating film IF3, and the fourth insulating film IF4 is formed.

In First Embodiment, only the third insulating film IF3 is formed without forming the fourth insulating film IF4. In this case, if the third insulating film IF3 is comprised of an oxygen-containing film, for example, an $SiO_2$ film, the exposed data recording layer MR or base layer BF may be oxidized. Before formation of the third insulating film IF3, therefore, the oxygen-free fourth insulating film IF4 is formed.

Figure 22:
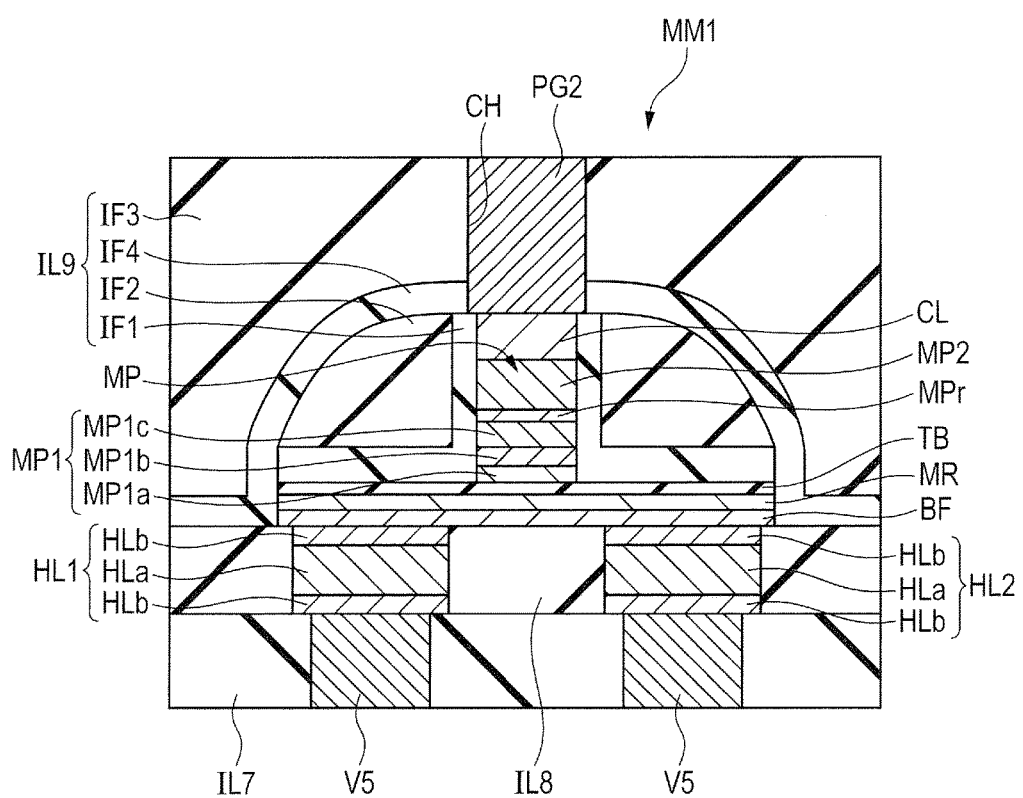
FIG. 22 is a fragmentary cross-sectional view showing a manufacturing step of the semiconductor device following that of FIG. 21.

Next, as shown in FIG. 22, a plug PG2 is formed (Step S24 of FIG. 18).

A contact hole CH penetrating the interlayer insulating film IL9 (third insulating film IF3 and fourth insulating film IF4) and reaching the upper surface of the cap layer CL is formed. A conductive film is then formed to fill the contact hole CH therewith. Thus, a plug PG2 made of the conductive film with which the contact hole CH has been filled CH is formed.

Although not illustrated here, wirings are then formed on the interlayer insulating film IL9. By these steps, selection transistors TR1 and TR2, wirings M1 to M7, and a magnetic memory cell MM1 can be formed.

In addition to the advantage of First Embodiment, Third Embodiment can suppress oxidation of the data recording layer and the like so that the magnetic memory cell MM1 thus obtained can have improved reliability. In addition to the advantage of Second Embodiment, the present embodiment can reduce the manufacturing TAT and manufacturing cost.

Fourth Embodiment

In First, Second, and Third Embodiments, application examples to a magnetic domain wall displacement type MRAM has been described. In Fourth Embodiment, on the other hand, an application example to MRAM (STT-MRAM) using a spin transfer torque (STT) will be described.

<Configuration of Magnetic Memory Cell>

Figure 23:
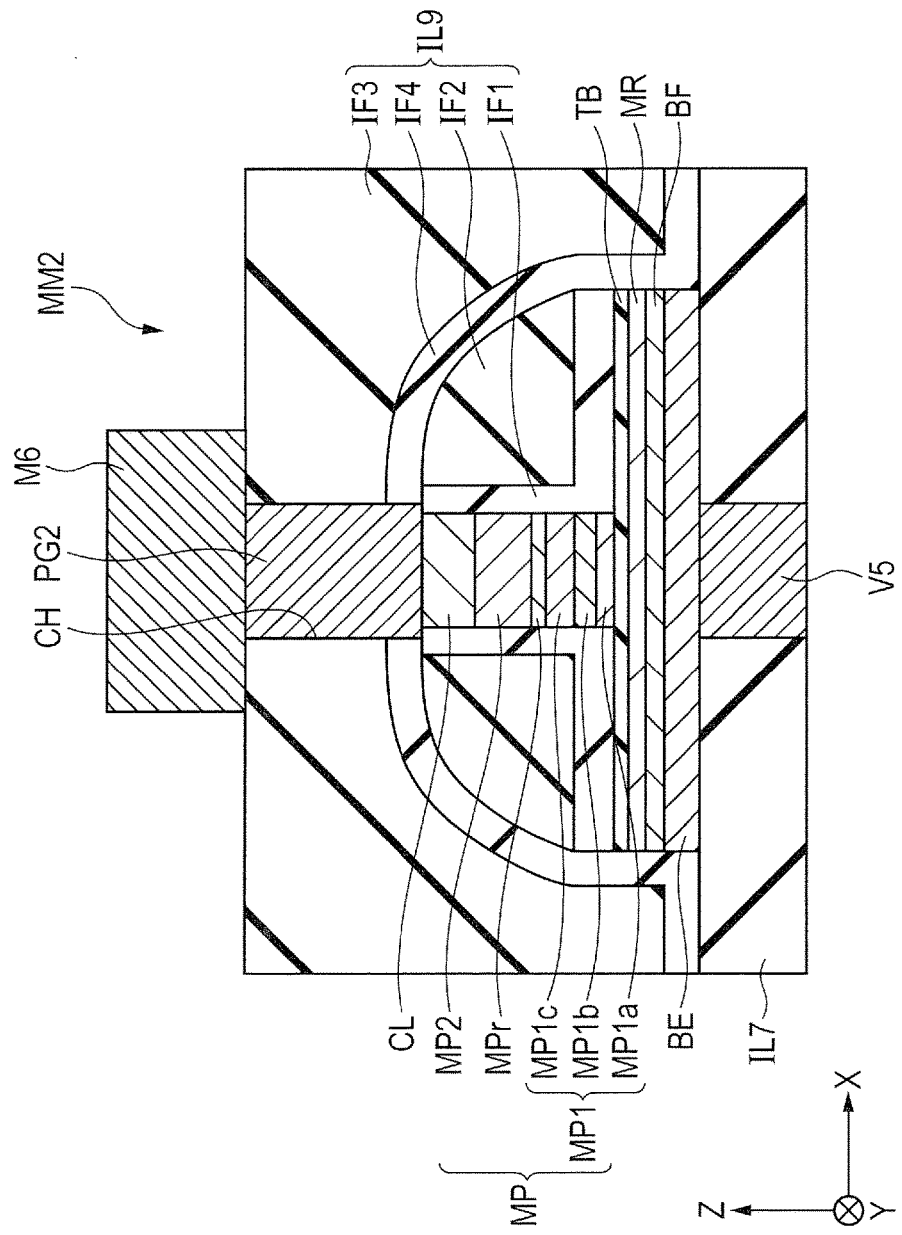
FIG. 23 is a fragmentary cross-sectional view showing a magnetic memory cell according to Fourth Embodiment.

Configuration of a magnetic memory cell according to Fourth Embodiment will be described referring to FIG. 23. FIG. 23 is a fragmentary cross-sectional view showing the magnetic memory cell according to Fourth Embodiment.

As shown in FIG. 23, a magnetic memory cell MM2 has a lower electrode layer BE, a base layer BF, a data recording layer MR, a tunnel barrier layer TB, a data reference layer MP, and a cap layer CL. In Fourth Embodiment, a magnetic tunnel junction is comprised of the data recording layer (magnetic layer) MR, the tunnel barrier layer (insulating layer) TB, and the data reference layer (magnetic layer) MP.

The lower electrode layer BE lies on a via portion V5 buried in an interlayer insulating film IL7 and is electrically coupled to the via portion V5. The lower electrode layer BE is made of a conductive film. As the lower electrode layer BE, a conductive film such as Ta film, TaN film, Ru film, Pt film, Ti film, or TiN film can be used. Alternatively, as the lower electrode layer BE, a conductive film made of a film obtained by stacking a Ta film, an Ru film, and a Ta film may be used.

The base layer BF lies between the data recording layer MR and the lower electrode layer BE. The base layer BF is a non-magnetic conductive film. The base layer BF in Fourth Embodiment is almost similar to the base layer BF in First Embodiment.

The data recording layer MR and the data reference layer MP are each a ferromagnetic film and they may be comprised of a plurality of ferromagnetic layers.

The data recording layer MR and the data reference layer MP each have perpendicular magnetic anisotropy. This means that the magnetization direction of each of the data recording layer MR and the data reference layer MP is parallel to the thickness direction of each film and perpendicular to the upper surface of each film.

The data recording layer MR and the data reference layer MP in Fourth Embodiment are almost similar to the data recording layer MR and the data reference layer MP in First Embodiment. The data recording layer MR and the data reference layer MP in Fourth Embodiment, similar to those in First Embodiment, each contain Co, Fe, and B. When such a ferromagnetic film containing Co, Fe, and B has a body-centered cubic structure, the resulting magnetic tunnel junction can have a higher MR ratio.

The tunnel barrier layer TB is comprised of a non-magnetic insulating film. The tunnel barrier layer TB in Fourth Embodiment is almost similar to the tunnel barrier layer TB in First Embodiment and the tunnel barrier layer TB preferably contains MgO.

The cap layer CL is a metal film and is almost similar to the cap layer CL in First Embodiment.

Further, a first insulating film IF1 lies in contact with the upper surface of the tunnel barrier layer TB having thereon no data reference layer MP and the respective side walls of the data reference layer MP and the cap layer CL. The first insulating film IF1 is preferably an oxygen-free insulating film in order to prevent oxidation of the metal film configuring the data reference film MP and the cap layer CL and it may be, for example, an $Si_3N_4$ film or an SiCN film.

Further, a second insulating film IF2 lies right above the upper surface of the tunnel barrier layer TB having thereon no data reference layer MP and at the same time, outside the respective side walls of the data reference layer MP and the cap layer CL. As the second insulating film IF2, for example, an $SiO_2$ film can be used.

Further, an oxygen-free fourth insulating film IF4 and a third insulating film IF3 are formed so as to cover, as well as the first insulating film IF1 and the second insulating film IF2, the base layer BF, the data recording layer MR, the tunnel barrier layer TB, the data reference layer MP, and the cap layer CL. As the oxygen-free fourth insulating film IF4, for example, an $Si_3N_4$ film or an SiCN film can be used. As the third insulating film IF3, for example, an $SiO_2$ film can be used. The first insulating film IF1, the second insulating film IF2, the third insulating film IF3, and the fourth insulating film IF4 configure an interlayer insulating film IL9 that covers the magnetic memory cell MM2 therewith.

The interlayer insulating film IL9 has, in the upper surface thereof, a contact hole CH that penetrates the interlayer insulating film IL9 and reaches the upper surface of the cap layer CL. The contact hole CH has therein a plug PG2 made of a conductive film with which the contact hole CH has been filled. The plug PG2 has thereon a wiring M6.

<Configuration of Semiconductor Device Having Magnetic Memory Cell>

Figure 24:
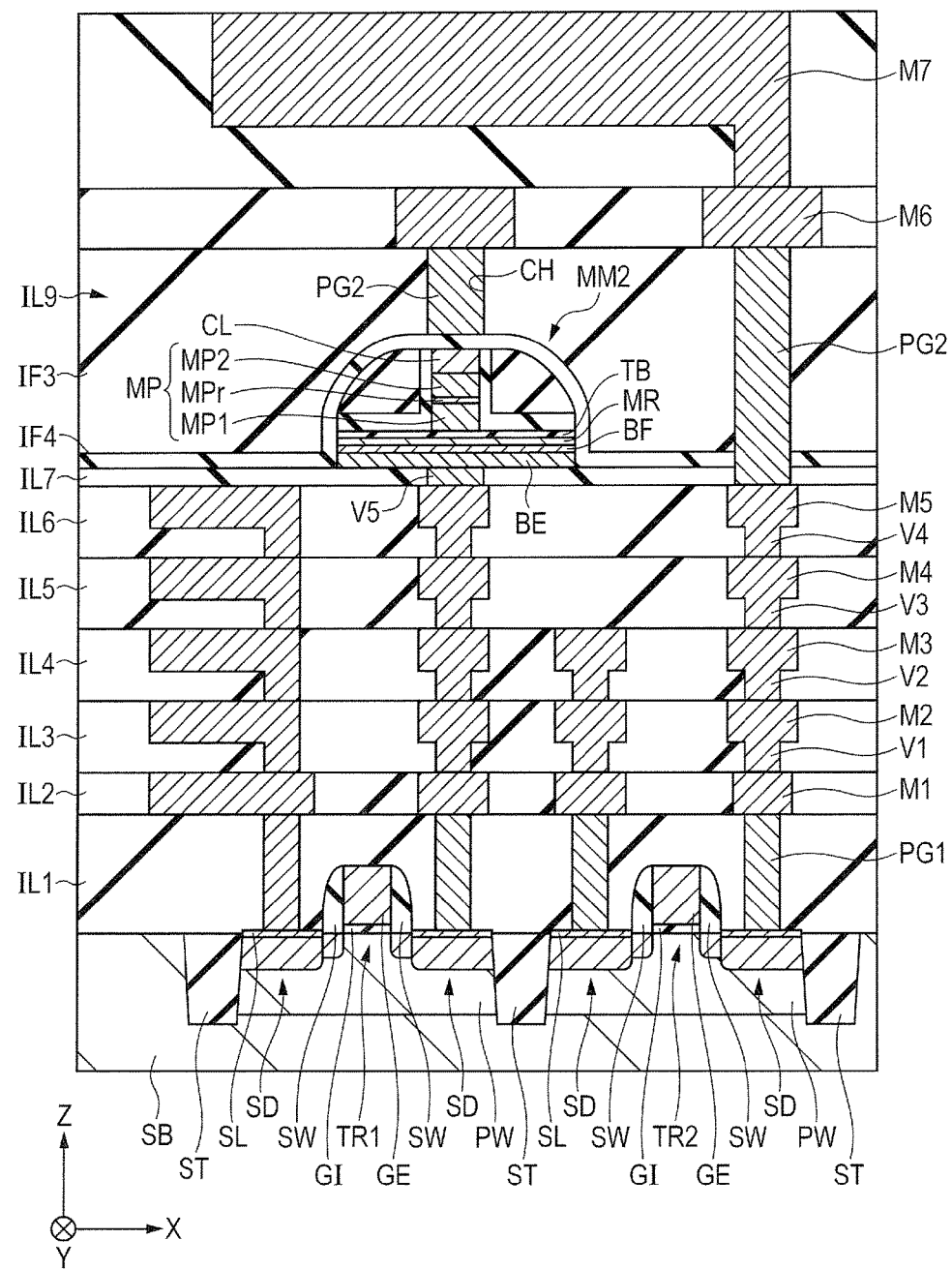
FIG. 24 is a fragmentary cross-sectional view showing a semiconductor device having the magnetic memory cell according to Fourth Embodiment.

The configuration of a semiconductor device having the magnetic memory cell according to Fourth Embodiment will be described referring to FIG. 24. FIG. 24 is a fragmentary cross-sectional view showing the semiconductor device having the magnetic memory cell according to Fourth Embodiment.

As shown in FIG. 24, the magnetic memory cell MM2 is, at one end thereof, coupled to one selection transistor TR1 in series. The magnetic memory cell MM2 is, at the other end thereof, coupled to a bit line (not shown) via a plug PG2. A portion of the semiconductor device according to Fourth Embodiment below the magnetic memory cell MM2 is almost similar to a portion of the semiconductor device according to First Embodiment below the magnetic memory cell MM1. In addition, selection transistors TR1 and TR2 in Fourth Embodiment can be made similar to the selection transistors TR1 and TR2 in First Embodiment described referring to FIG. 2.

<Operation of Magnetic Memory Cell>

Figure 25:
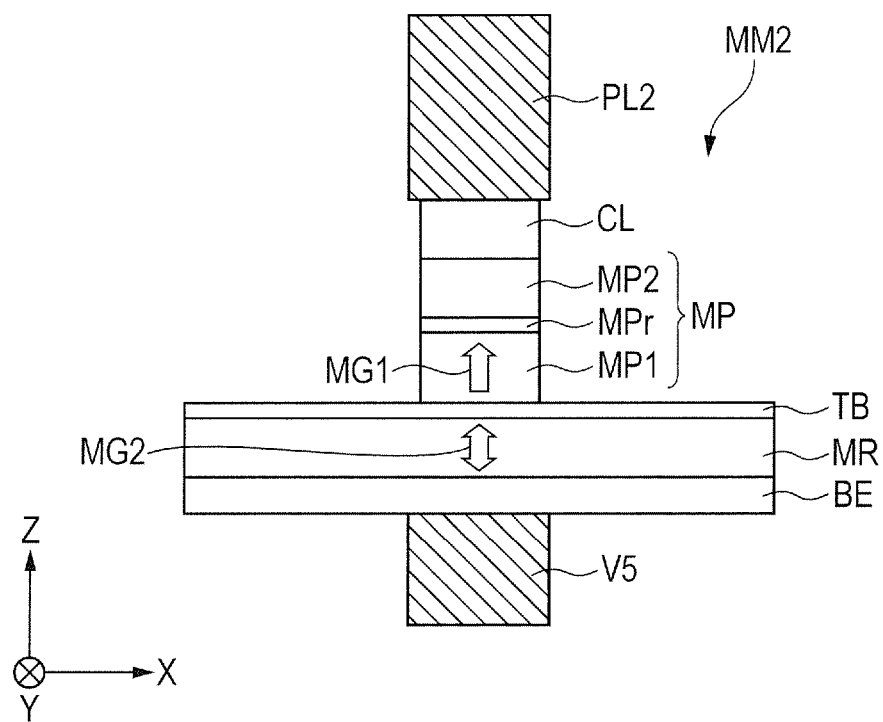
FIG. 25 is a schematic view of the magnetic memory cell according to Fourth Embodiment for describing the operation of the magnetic memory cell.

Operation of the magnetic memory cell according to Fourth Embodiment will be described referring to FIG. 25. FIG. 25 is a schematic view of the magnetic memory cell for describing the operation of the magnetic memory cell according to Fourth Embodiment. In FIG. 25, the magnetization direction of each of the data recording layer MR and the data reference layer MP is shown schematically by an arrow.

As shown in FIG. 25, for example, the data reference layer MP has magnetization MG1 pinned to the +Z axis direction. The data recording layer MR has, on the other hand, magnetization MG2 reversible between the Z+ axis direction and the −Z axis direction.

Next, data write operation in the magnetic memory cell MM2 of Fourth Embodiment will be described. In Fourth Embodiment, similar to First Embodiment, data "1" means a state where the magnetization MG1 of the data reference layer MP is pinned to the +Z axis direction and the magnetization MG2 of the data recording layer MR is in the −Z axis direction. Data "0" means a state where the magnetization MG1 of the data reference layer MP is pinned to the +Z axis direction and the magnetization MG2 of the data recording layer MR is in the +Z axis direction. The magnetization and the value of data may be reversed.

When data "1" is written into the magnetic memory cell MM2 into which data "0" has been written, a write current is caused to flow in the direction from the cap layer CL to the base layer BF via the data recording layer MR. At this time, electrons having a spin torque in directions opposite to each other are injected into the data recording layer MR. Electrons having a spin torque in one of these directions are reflected at the data recording layer MR, by which the magnetization MG2 of the data recording layer MR is vertically inverted.

When data "0" is written into the magnetic memory cell MM2 into which data "1" has been written, a write current is caused to flow from the lower electrode layer BE to the data reference layer MP via the data recording layer MR. At this time, electrons having a spin torque in one of the directions opposite to each other that have passed through the data reference layer MP are injected and the magnetization MG2 of the data recording layer MR is vertically inverted.

In other words, the magnetization MG2 of the data recording layer MR changes by flowing of a write current between the lower electrode layer BE and the cap layer CL via the data recording layer MR.

The data read operation of the magnetic memory cell MM2 can be carried out in a manner similar to the read operation of the magnetic memory cell MM1 of First Embodiment. This means that a read current is caused to flow between the data reference layer MP and the lower electrode layer BE and the resistance value is detected by the value of a current flowing therebetween.

<Method of Manufacturing Semiconductor Device>

Figure 26:
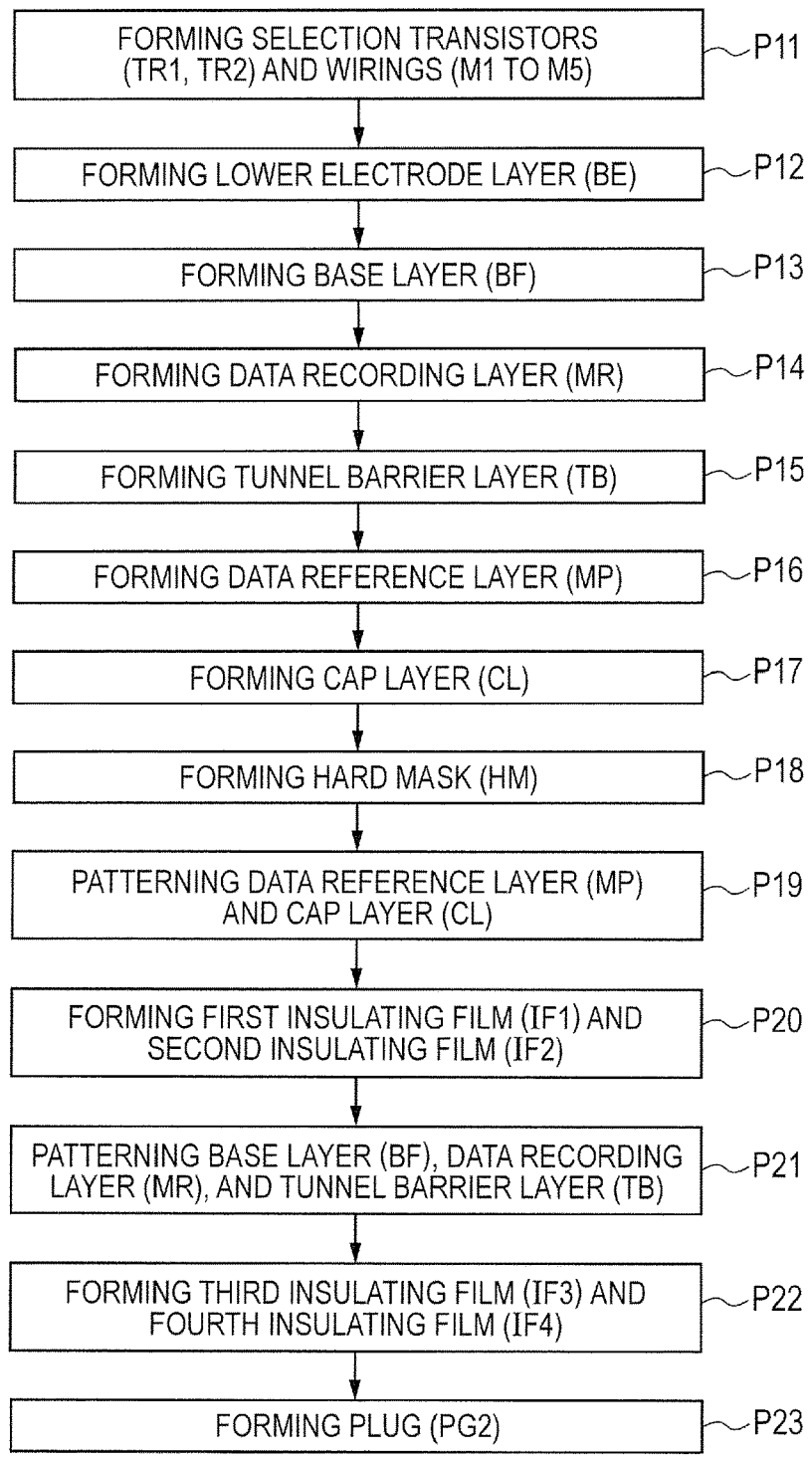
FIG. 26 is a process flow chart showing some manufacturing steps of the semiconductor device according to Fourth Embodiment.

A method of manufacturing the magnetic memory cell according to Fourth Embodiment will be described in the order of steps based on FIGS. 26 to 32. FIG. 26 is a process flow chart showing some manufacturing steps of the semiconductor device according to Fourth Embodiment. FIGS. 27 to 32 are fragmentary cross-sectional views showing the manufacturing steps of the semiconductor device according to Fourth Embodiment. FIGS. 27 to 32 are enlarged views of a region having therein the magnetic memory cell. Manufacturing procedures until the formation of the via portion V5 are similar to those of First Embodiment so that a description on them is omitted (Step S11 of FIG. 5, refer to FIG. 6).

As shown in FIG. 6, two selection transistors TR1 and TR2 are formed and further, wirings M1 to M5 are formed above the selection transistors TR1 and TR2 (Step P11 of FIG. 26).

Next, a magnetic memory cell MM2 is formed on the interlayer insulating film IL7 having therein the via portion V5.

Figure 27:
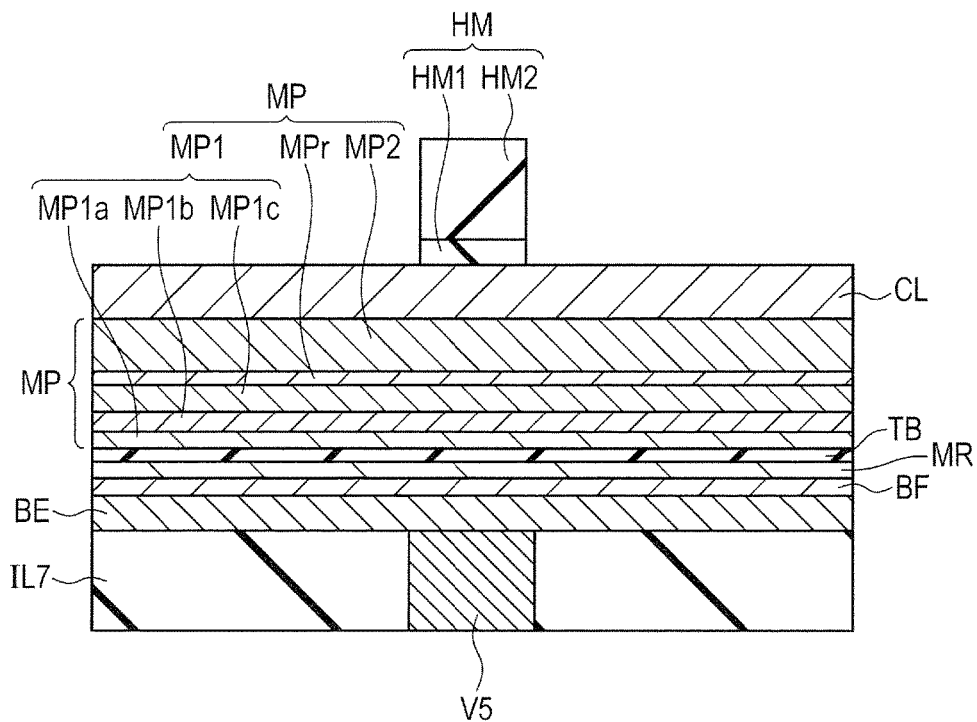
FIG. 27 is a fragmentary cross-sectional view showing a manufacturing step of the semiconductor device according to Fourth Embodiment.

First, as shown in FIG. 27, a lower electrode layer BE is formed (Step P12 of FIG. 26).

For example, a conductive film for lower electrode layer BE is deposited by sputtering or the like on the interlayer insulating film IL7 having therein the via portion V5. As the conductive film, for example, a Ta film, a TaN film, a Pt film, an Ru film, a Ti film, or a TiN film can be used. Alternatively, a film obtained by stacking a Ta film, an Ru film, and a Ta film may be used as the conductive film.

Next, a base layer BF is formed (Step P13 of FIG. 26).

A base layer BF is formed on the lower electrode layer BE. The base layer BF is a non-magnetic conductive film and it is, for example, a Ta film or a TaN film in amorphous form or in not fully crystallized form. The base layer BF has a thickness of, for example, from about 1 to 5 nm.

Next, a data recording layer MR is formed (Step P14 of FIG. 26).

A data recording layer MR is deposited on the base layer BF by sputtering or the like. The data recording layer MR is, for example, a CoFeB film. The base layer BF formed in Step P13 is in amorphous form or in not fully crystallized form. The recording layer MR formed on the base layer BF in Step P14 is not susceptible to the influence of the crystal structure of the base layer BF and is, for example, in amorphous form or in not fully crystallized form. The data recording layer MR has a thickness of, for example, from about 0.5 to 2 nm.

Next, a tunnel barrier layer TB is formed (Step P15 of FIG. 26).

A non-magnetic insulating film is deposited on the data recording layer MR by sputtering or the like. The tunnel barrier layer TB is, for example, an MgO film. The MgO film may be formed by RF sputtering or alternatively, an MgO film may be formed by forming a Mg film by sputtering and then oxidizing the surface of the Mg film. This Mg film formation and oxidation may be repeated in a plurality of times. This Mg film formation and oxidation may be performed in separate chambers (processing rooms) or they may be performed in the same chamber. The tunnel barrier layer TB has a thickness of, for example, from about 1 to 2 nm.

Next, a data reference layer MP is formed (Step P16 of FIG. 26).

For example, a first ferromagnetic layer MP1, a non-magnetic layer MPr, and a second ferromagnetic layer MP2 are successively deposited on the tunnel barrier layer TB by sputtering or the like. The first ferromagnetic layer MP1 is comprised of, for example, a CoFeB film MP1$a$, a Ta film MP1$b$, and a Co/Pt stacked film MP1$c$. The non-magnetic layer MPr is, for example, an Ru film. The second ferromagnetic layer MP2 is, for example, a Co/Pt stacked film. The Co/Pt stacked film is a film stack obtained by stacking a thin Co film and a thin Pt film in repetition.

Next, a cap layer CL is formed (Step P17 of FIG. 26).

For example, a non-magnetic conductive film is deposited on the data reference layer MP by sputtering or the like. The cap layer CL is a film stack obtained, for example, by stacking a Pt film, an Ru film, a Pt film, an Ru film, a Pt film, and a Ta film one after another in order of mention.

Next, a hard mask HM is formed (Step P18 of FIG. 26).

A hard mask HM for patterning the data reference layer MP and the cap layer CL is formed on the cap layer CL. The hard mask HM is comprised of a film stack obtained, for example, by successively depositing an $Si_3N_4$ film HM1 and an $SiO_2$ film HM2. The $Si_3N_4$ film HM1 has a thickness of, for example, about 30 nm and the $SiO_2$ film HM2 has a thickness of, for example, about 150 nm.

Figure 28:
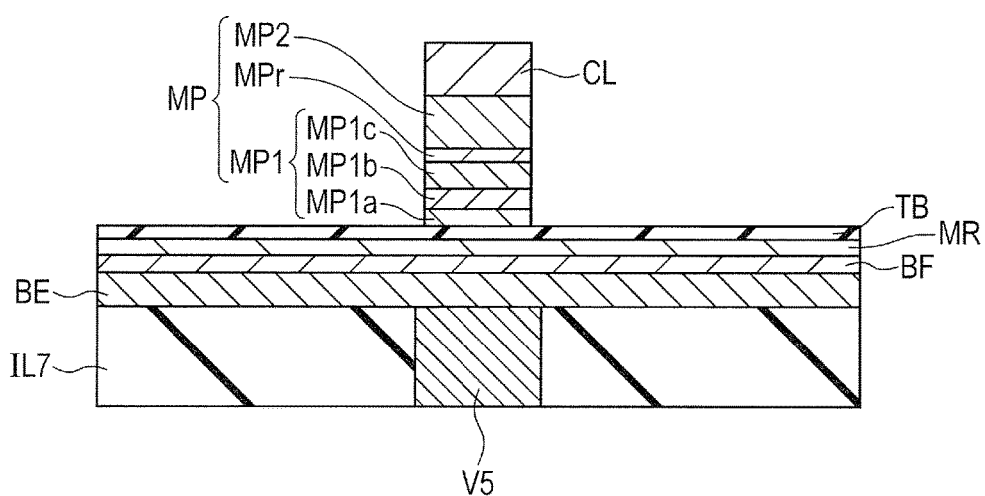
FIG. 28 is a fragmentary cross-sectional view showing a manufacturing step of the semiconductor device following that of FIG. 27.

Next, as shown in FIG. 28, the data reference layer MP and the cap layer CL are patterned (Step P19 of FIG. 26).

The cap layer CL and the data reference layer MB are successively etched using the hard mask HM to pattern the data reference layer MB and the cap layer CL so as to leave them between the magnetic pinned layer HL1 and the magnetic pinned layer HL2 in plan view. The hard mask HM is then removed. As a result, a magnetic tunnel junction comprised of the data recording layer MR, the tunnel barrier layer TB, and the first ferromagnetic layer MP1 of the data reference layer MP is formed.

Figure 29:
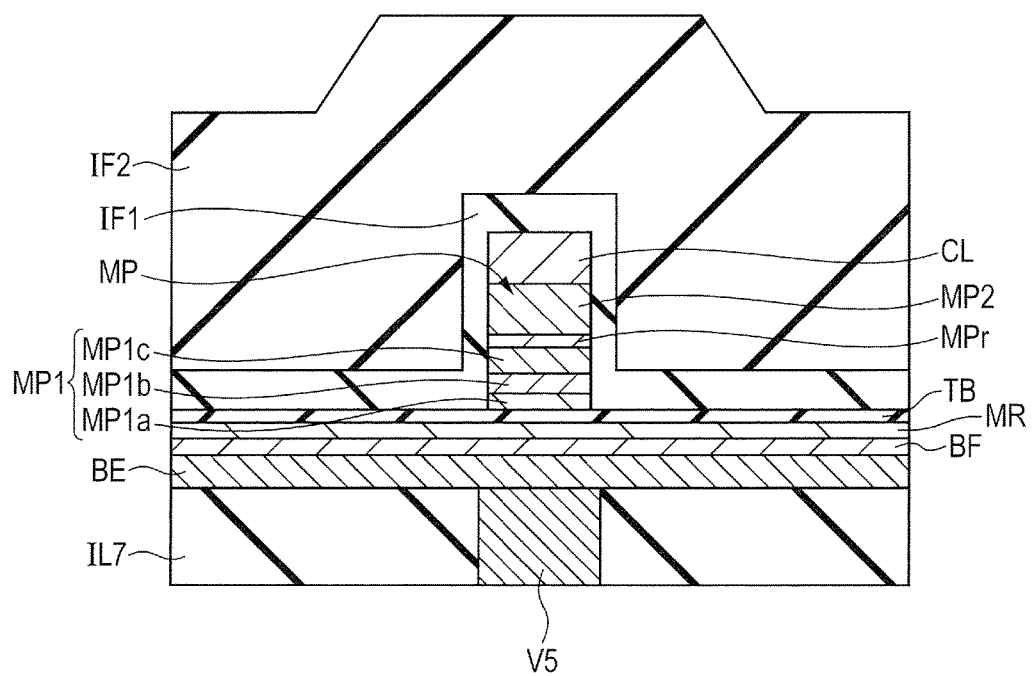
FIG. 29 is a fragmentary cross-sectional view showing a manufacturing step of the semiconductor device following that of FIG. 28.

Next, as shown in FIG. 29, a first insulating film IF1 and a second insulating film IF2 are formed successively (Step P20 of FIG. 26).

A first insulating film IF1 and a second insulating film IF2 are deposited successively on the tunnel barrier layer TB by plasma CVD or the like to cover the data reference layer MP and the cap layer CL. The first insulating film IF1 is preferably an oxygen-free insulating film in order to prevent oxidation of the metal film configuring the data reference film MP and the cap layer CL. It is, for example, an $Si_3N_4$ film or an SiCN film and has a film thickness of, for example, about 30 nm. The second insulating film IF2 is, for example, an $SiO_2$ film and has a film thickness of, for example, about 250 nm.

Figure 30:
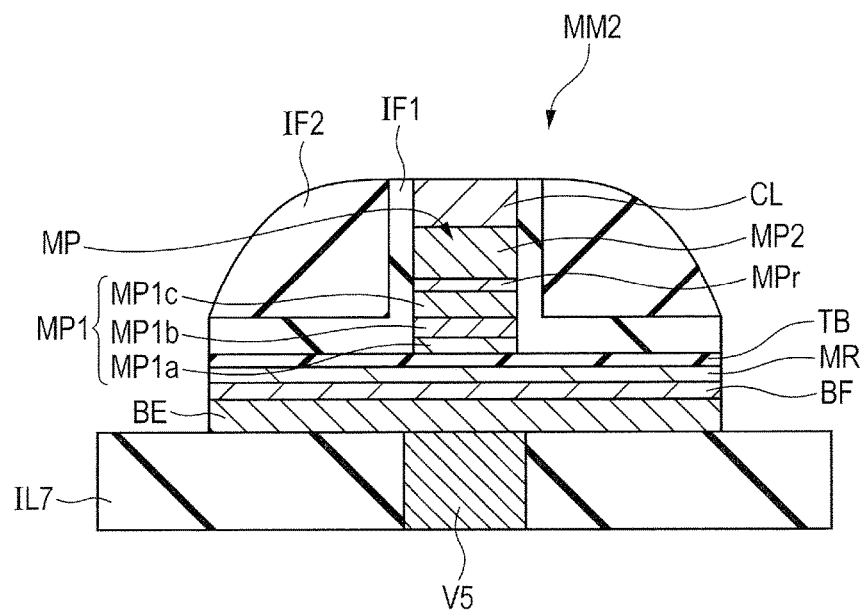
FIG. 30 is a fragmentary cross-sectional view showing a manufacturing step of the semiconductor device following that of FIG. 29.

Next, as shown in FIG. 30, the base layer BF, the data recording layer MR, and the tunnel barrier layer TB are patterned (Step P21 of FIG. 26).

The second insulating film IF2 is processed, for example, by the whole-surface etchback using anisotropic dry etching, with the first insulating film IF1 as an etching stopper. Further the first insulating film IF1, the tunnel barrier layer TB, the data recording layer MR, the base layer BF, and the lower electrode layer BE are etched successively while using, as a mask, the second insulating film IF2 processed into a side wall form to pattern the lower electrode layer BE, the base layer BF, the data recording layer MR, and the tunnel barrier layer TB. As a result, formation of the magnetic memory cell MM2 is completed.

Figure 31:
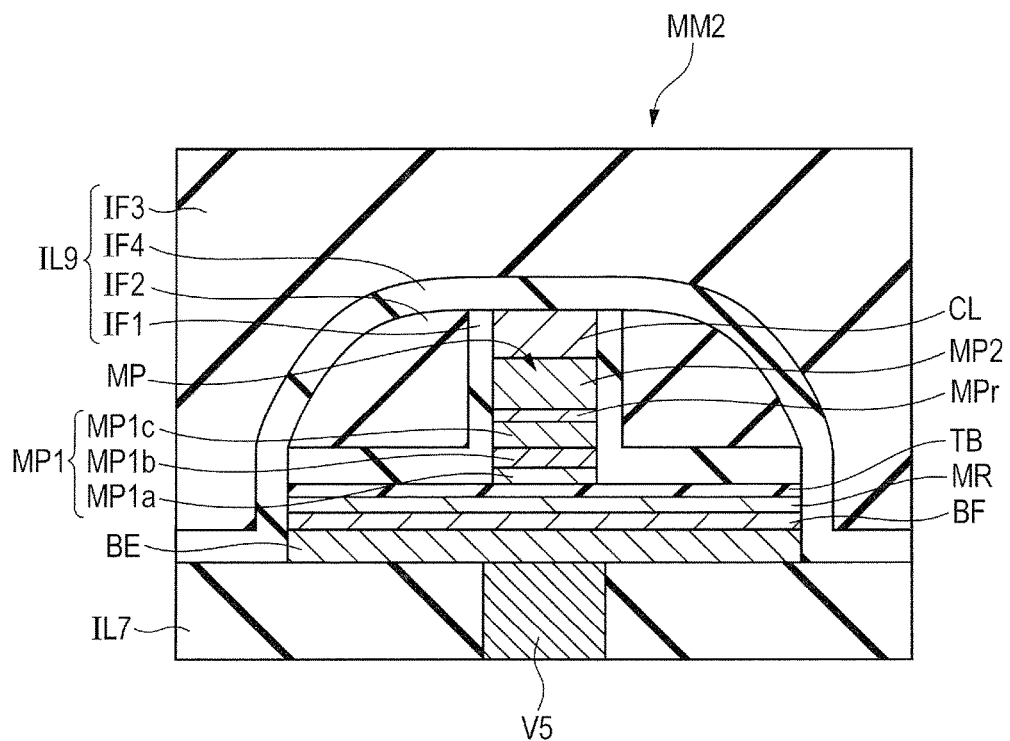
FIG. 31 is a fragmentary cross-sectional view showing a manufacturing step of the semiconductor device following that of FIG. 30.

Next, as shown in FIG. 31, an oxygen-free fourth insulating film IF4 and a third insulating film IF3 are formed successively (Step P22 of FIG. 26).

A fourth insulating film IF4 and a third insulating film IF3 are successively deposited by plasma CVD or the like so as to cover, as well as the first insulating film IF1 and the second insulating film IF2, the lower electrode layer BE, the base layer BF, the data recording layer MR, the tunnel barrier layer TB, the data reference layer MP, and the cap layer CL. The fourth insulating film IF4 is an oxygen-free film, for example, an $Si_3N_4$ film or an SiCN film and it has a thickness of, for example, about 30 nm. The third insulating film IF3 is, for example, an $SiO_2$ film and it has a thickness of, for example, about 540 nm. The upper surface of the third insulating film IF3 is then planarized by CMP or the like. As a result, an interlayer insulating film IL9 comprised of the first insulating film IF1, the second insulating film IF2, the third insulating film IF3, and the fourth insulating film IF4 is formed.

Figure 32:
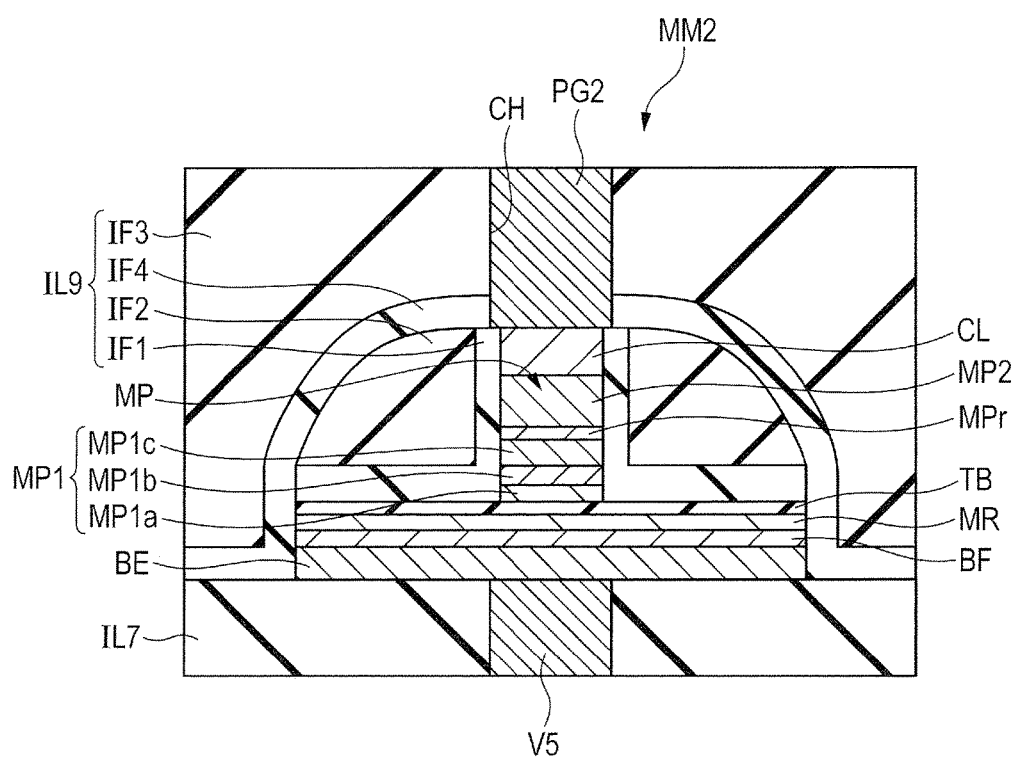
FIG. 32 is a fragmentary cross-sectional view showing a manufacturing step of the semiconductor device following that of FIG. 31.

Next, as shown in FIG. 32, a plug PG2 is formed (Step P23 of FIG. 26).

A contact hole CH penetrating the interlayer insulating film IL9 (third insulating film IL3 and fourth insulating film IF4) and reaching the upper surface of the cap layer CL is formed and a conductive film is formed to fill the contact hole CH. A plug PG2 comprised of the conductive film with which the contact hole CH has been filled is thus formed.

Although not illustrated, wirings are then formed on the interlayer insulating film IL9. By these steps, selection transistors TR1 and TR2, wirings M1 to M7, and the magnetic memory cell MM2 can be formed.

Also the STT-MRAM in Fourth Embodiment ca provide advantages almost similar to those of the magnetic domain wall displacement type MRAM described in First, Second, and Third Embodiments.

The invention made by the present inventors has been described specifically based on some embodiments. It is needless to say that the invention is not limited to or by these embodiments but can be changed variously without departing from the gist of the invention.

What is claimed is:
1. A semiconductor device, comprising:
a data recording layer having magnetization;
a tunnel barrier layer formed over the data recording layer;
a data reference layer formed over a portion of the tunnel barrier layer and having magnetization; and
a cap layer formed over the data reference layer,
wherein in plan view, the data recording layer and the tunnel barrier layer overlap with each other while having the same shape and the data reference layer and the cap layer overlap with each other while having the same shape,
wherein in plan view, the data reference layer is embraced in the data recording layer,
wherein the data reference layer and the cap layer have, in contact with the respective side walls thereof, a first insulating film, and
wherein the data recording layer and the tunnel barrier layer have, over respective side walls thereof, no first insulating film.

2. The semiconductor device according to claim 1, wherein the first insulating film is an oxygen-free insulating film.
3. The semiconductor device according to claim 1, wherein the first insulating film is a silicon nitride film or a silicon carbonitride film.
4. The semiconductor device according to claim 1, wherein the data recording layer and the tunnel barrier layer have, in contact with the respective side walls thereof, an oxygen-free second insulating film.
5. The semiconductor device according to claim 1, wherein the data reference layer has a structure obtained by stacking a first magnetic layer, a non-magnetic layer, and a second magnetic layer one after another.
6. The semiconductor device according to claim 1, wherein the data recording layer comprises:
a first region;
a second region located on a first side of the first region, and
a third region located on a second side opposite to the first side with the first region therebetween, and
wherein the semiconductor device further comprises:
a first magnetic pinned layer formed below the second region; and
a second magnetic pinned layer formed below the third region.
7. The semiconductor device according to claim 1, further comprising an electrode layer which lies below the data recording layer and in plan view, overlaps with the data recording layer while having the same shape.
8. A method of manufacturing a semiconductor device, comprising the steps of:
(a) depositing a data recording layer, a tunnel barrier layer, a data reference layer, and a cap layer successively over a semiconductor substrate;
(b) processing the data reference layer and the cap layer by using a first mask;
(c) depositing a first insulating film having a first thickness so as to cover the data recording layer, the tunnel barrier layer, the data reference layer, and the cap layer;
(d) depositing, over the first insulating film, a second insulating film having a second thickness greater than the first thickness; and
(e) processing the data recording layer, the tunnel barrier layer, the first insulating film, and the second insulating film by using a second mask,
wherein in the step (b), the data reference layer and the cap layer are processed so as to overlap with each other while having the same shape in plan view,
wherein in the step (e), the data reference layer and the cap layer have respective side walls covered with the first insulating film, and
wherein the data recording layer and the tunnel barrier layer are processed so that in plan view, the data recording layer and the tunnel barrier layer overlap with each other, while having the same shape, and the data recording layer embraces the data reference layer.
9. The method of manufacturing a semiconductor device according to claim 8,
wherein the first insulating film is an oxygen-free insulating film.
10. The method of manufacturing a semiconductor device according to claim 8,
wherein the first insulating film is a silicon nitride film or a silicon carbonitride film.
11. The method of manufacturing a semiconductor device according to claim 8, comprising, after the step (e), the step of:

(f) forming an oxygen-free third insulating film so as to cover the data recording layer, the tunnel barrier layer, the data reference layer, the cap layer, the first insulating film, and the second insulating film.

12. A method of manufacturing a semiconductor device, comprising the steps of:
   (a) successively depositing a data recording layer, a tunnel barrier layer, a data reference layer, and a cap layer over a semiconductor substrate;
   (b) processing the data reference layer and the cap layer by using a mask;
   (c) depositing a first insulating film having a first thickness so as to cover the data recording layer, the tunnel barrier layer, the data reference layer, and the cap layer;
   (d) depositing, over the first insulating film, a second insulating film having a second thickness greater than the first thickness; and
   (e) processing the data recording layer, the tunnel barrier layer, the first insulating film, and the second insulating film by anisotropic etching,
   wherein in the step (b), the data reference layer and the cap layer are processed so as to overlap with each other while having the same shape in plan view,
   wherein in the step (e), the data reference layer and the cap layer have respective side walls covered with the first insulating film, and
   wherein the data recording layer and the tunnel barrier layer are processed so that in plan view, the data recording layer and the tunnel barrier layer overlap with each other, while having the same shape, and the data recording layer embraces the data reference layer.

13. The method of manufacturing a semiconductor device according to claim 12,
   wherein the first insulating film is an oxygen-free insulating film.

14. The method of manufacturing a semiconductor device according to claim 12,
   wherein the first insulating film is a silicon nitride film or a silicon carbonitride film.

15. The method of manufacturing a semiconductor device according to claim 12, comprising, after the step (e), the step of:
   (f) forming an oxygen-free third insulating film so as to cover the data recoding layer, the tunnel barrier layer, the data reference layer, the cap layer, the first insulating film, and the second insulating film.

* * * * *